(12) United States Patent
Kirikihira et al.

(10) Patent No.: US 9,899,211 B2
(45) Date of Patent: Feb. 20, 2018

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: HITACHI KOKUSAI ELECTRIC INC., Tokyo (JP)

(72) Inventors: Kaori Kirikihira, Toyama (JP); Yugo Orihashi, Toyama (JP); Satoshi Shimamoto, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 14/613,926

(22) Filed: Feb. 4, 2015

(65) Prior Publication Data

US 2015/0214030 A1     Jul. 30, 2015

Related U.S. Application Data

(63) Continuation of application No. 13/788,122, filed on Mar. 7, 2013, now Pat. No. 8,987,146.

(30) Foreign Application Priority Data

Mar. 9, 2012   (JP) ................. 2012-053787

(51) Int. Cl.
*H01L 21/31*    (2006.01)
*H01L 21/02*    (2006.01)
(Continued)

(52) U.S. Cl.
CPC .......... *H01L 21/0228* (2013.01); *C23C 16/30* (2013.01); *C23C 16/4412* (2013.01);
(Continued)

(58) Field of Classification Search
CPC .......... H01L 21/0228; H01L 21/02205; C23C 16/4412; C23C 16/52; C23C 16/455
(Continued)

(56) References Cited

U.S. PATENT DOCUMENTS 6,143,659 A * 11/2000 Leem ............... C23C 16/06
117/9
7,713,884 B2    5/2010 Ito et al.
(Continued)

FOREIGN PATENT DOCUMENTS

JP    2006-024668 A    1/2006
JP    2009-004608 A    1/2009
(Continued)

OTHER PUBLICATIONS

Lesker Tech. vol. 3, Issue 1, Mar. 2004.*

*Primary Examiner* — Syed Gheyas
(74) *Attorney, Agent, or Firm* — Volpe and Koenig, P.C.

(57) ABSTRACT

A method of manufacturing a semiconductor device, includes: forming a film on a substrate by performing a cycle a predetermined number of times, the cycle including: supplying a raw material gas to a substrate in a process chamber, exhausting the raw material gas remaining in the process chamber through an exhaust line, supplying an amine-based gas; and exhausting the amine-based gas through the exhaust line with the supply of the amine-based gas stopped. A degree of valve opening of an exhaust valve disposed in the exhaust line is changed in multiple steps in the process of exhausting the amine-based gas.

18 Claims, 9 Drawing Sheets

(51) Int. Cl.
   *H01L 21/67* (2006.01)
   *C23C 16/30* (2006.01)
   *C23C 16/44* (2006.01)
   *C23C 16/455* (2006.01)
   *C23C 16/52* (2006.01)

(52) U.S. Cl.
   CPC ...... *C23C 16/455* (2013.01); *C23C 16/45531* (2013.01); *C23C 16/45546* (2013.01); *C23C 16/52* (2013.01); *H01L 21/0214* (2013.01); *H01L 21/02104* (2013.01); *H01L 21/02126* (2013.01); *H01L 21/02167* (2013.01); *H01L 21/02205* (2013.01); *H01L 21/02211* (2013.01); *H01L 21/6715* (2013.01); *H01L 21/67109* (2013.01)

(58) Field of Classification Search
   USPC .......................................................... 438/778
   See application file for complete search history.

(56) References Cited

U.S. PATENT DOCUMENTS

| 2003/0201541 | A1* | 10/2003 | Kim ........................ C23C 16/18 257/766 |
| --- | --- | --- | --- |
| 2005/0284370 | A1* | 12/2005 | Strang .................... C23C 16/402 118/715 |
| 2006/0286775 | A1* | 12/2006 | Singh .................. C23C 16/0227 438/478 |
| 2008/0132079 | A1 | 6/2008 | Okada et al. |
| 2009/0181550 | A1 | 7/2009 | Hasebe et al. |
| 2011/0033956 | A1 | 2/2011 | Sakai |
| 2012/0190215 | A1 | 7/2012 | Ikeuchi et al. |
| 2013/0078376 | A1* | 3/2013 | Higashino ............... C23C 16/34 427/255.39 |

FOREIGN PATENT DOCUMENTS

| JP | 2009-283587 A | 12/2009 |
| --- | --- | --- |
| JP | 2012-015344 A | 1/2012 |
| KR | 10-2008-0031634 A | 4/2008 |
| KR | 10-2011-0015392 A | 2/2011 |
| TW | 200949946 A1 | 12/2009 |
| TW | 201209921 A1 | 3/2012 |
| WO | 2011/123792 A2 | 10/2011 |

* cited by examiner

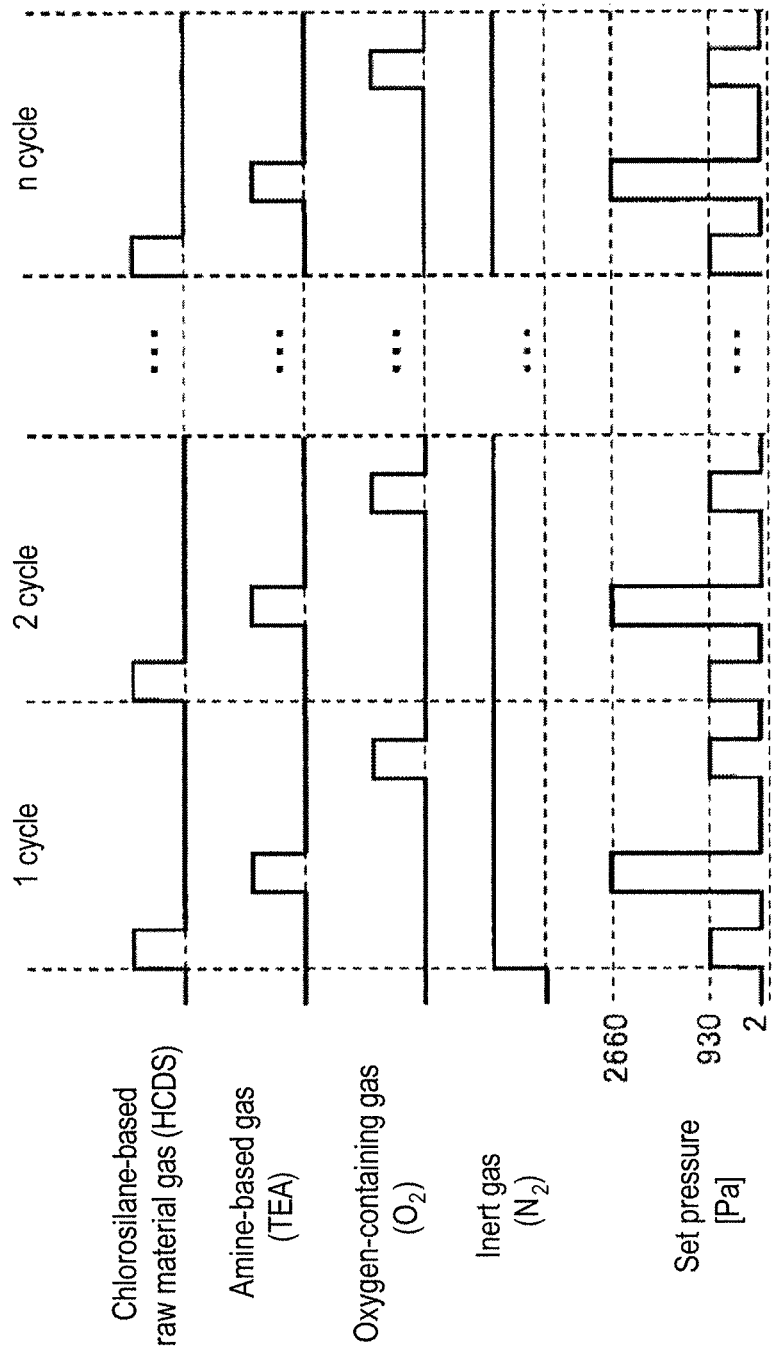

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED APPLICATION

This application is a continuation of U.S. patent application Ser. No. 13/788,122, filed Mar. 7, 2013, which claims priority from Japanese Patent Application No. 2012-05378, filed on Mar. 9, 2012, the entire content of which is incorporated herein by reference.

TECHNICAL FIELD

The present disclosure relates to a method of manufacturing a semiconductor device, including a process of forming a film on a substrate, a method of processing a substrate, a substrate processing apparatus, and a non-transitory computer-readable recording medium for storing instructions for executing such methods.

BACKGROUND

When a film, such as an insulating film to form a sidewall spacer (SWS) of a gate electrode in a transistor, is formed on a substrate of a semiconductor device, there is a need to form the film at a low temperature in order to prevent diffusion of impurities. There is also a need for such an insulating film to have a low dielectric constant in order to provide a small parasitic capacitance and have a high hydrogen fluoride (HF) resistance in order to maintain its shape in a cleaning process after forming the sidewall spacer. A high quality insulating film to meet such a need may be provided by controlling a composition ratio of the film, for example, a percentage of silicon (Si), oxygen (O), carbon (C), nitrogen (N) or the like contained in the film. Moreover, there is an additional need to control conditions for supplying various kinds of process gases for the purpose of controlling the film composition ratio.

A plurality of process gases have been used to form a film such as the above-mentioned sidewall spacer film in order to further reduce a dielectric constant in a low temperature region and improve the HF resistance. However, if for example an amount of gas exceeding an exhaust capacity is exhausted at one time, gas may stay in an exhaust pipe (exhaust line), which may result in deposition of byproducts in the exhaust pipe and increase in a back pressure of a vacuum pump disposed in the exhaust pipe, and hence cause blocking of the exhaust pipe.

SUMMARY

The present disclosure provides some embodiments of a semiconductor device manufacturing method, a substrate processing method, a substrate processing apparatus and a computer-readable recording medium for storing instructions thereon for executing such methods, which are capable of preventing byproducts from being deposited in an exhaust pipe when a film is formed.

According to some embodiments, there is provided a method of manufacturing a semiconductor device, including: forming a film on a substrate by performing a cycle a predetermined number of times, the cycle including: supplying a raw material gas to a substrate in a process chamber; exhausting the raw material gas remaining in the process chamber through an exhaust line in a state where the supply of the raw material gas is being stopped; supplying an amine-based gas to the substrate in the process chamber; and exhausting the amine-based gas remaining in the process chamber through the exhaust line in a state where the supply of the amine-based gas is being stopped. A degree of valve opening of an exhaust valve disposed in the exhaust line is changed in multiple steps in the act of exhausting the amine-based gas remaining in the process chamber.

According to some other embodiments, there is provided is a method of processing a substrate, including: forming a film on the substrate by performing a cycle a predetermined number of times, the cycle including: supplying a raw material gas to a substrate in a process chamber; exhausting the raw material gas remaining in the process chamber through an exhaust line in a state where the supply of the raw material gas is being stopped; supplying an amine-based gas to the substrate in the process chamber; and exhausting the amine-based gas remaining in the process chamber through the exhaust line in a state where the supply of the amine-based gas is being stopped. A degree of valve opening of an exhaust valve disposed in the exhaust line is changed in multiple steps in the act of exhausting the amine-based gas remaining in the process chamber.

According to some other embodiments, there is provided a substrate processing apparatus including: a process chamber configured to accommodate a substrate; a raw material gas supply system configured to supply a raw material gas to the substrate in the process chamber; an amine-based gas supply system configured to supply an amine-based gas to the substrate in the process chamber; an exhaust line configured to exhaust the interior of the process chamber; an exhaust valve disposed in the exhaust line; and a controller configured to control the raw material gas supply system, the amine-based gas supply system, the exhaust line and the exhaust valve such that a film is formed on the substrate by performing a cycle a predetermined number of times, the cycle including: supplying the raw material gas to a substrate in a process chamber; exhausting the raw material gas remaining in the process chamber through an exhaust line in a state where the supply of the raw material gas is being stopped; supplying the amine-based gas to the substrate in the process chamber; and exhausting the amine-based gas remaining in the process chamber through the exhaust line in a state where the supply of the amine-based gas is being stopped. A degree of valve opening of the exhaust valve is changed in multiple steps in the act of exhausting the amine-based gas remaining in the process chamber.

According to yet other embodiments, there is provided a computer-readable recording medium storing a program that causes a computer to perform a method of manufacturing a semiconductor device, the method including: forming a film on a substrate by performing a cycle including: supplying a raw material gas to a substrate in a process chamber; exhausting the raw material gas remaining in the process chamber through an exhaust line in a state where the supply of the raw material gas is being stopped; supplying an amine-based gas to the substrate in the process chamber; and exhausting the amine-based gas remaining in the process chamber through the exhaust line in a state where the supply of the amine-based gas is being stopped. A degree of valve opening of an exhaust valve disposed in the exhaust line is changed in multiple steps in the act of exhausting the amine-based gas remaining in the process chamber.

BRIEF DESCRIPTION OF THE DRAWINGS

FIGS. 8A and 8B are a timing diagram of gas being supplied in a film forming sequence of an example of the present disclosure and a timing diagram of gas being supplied in a film forming sequence of a comparative example, respectively.

DETAILED DESCRIPTION

Figure 1:
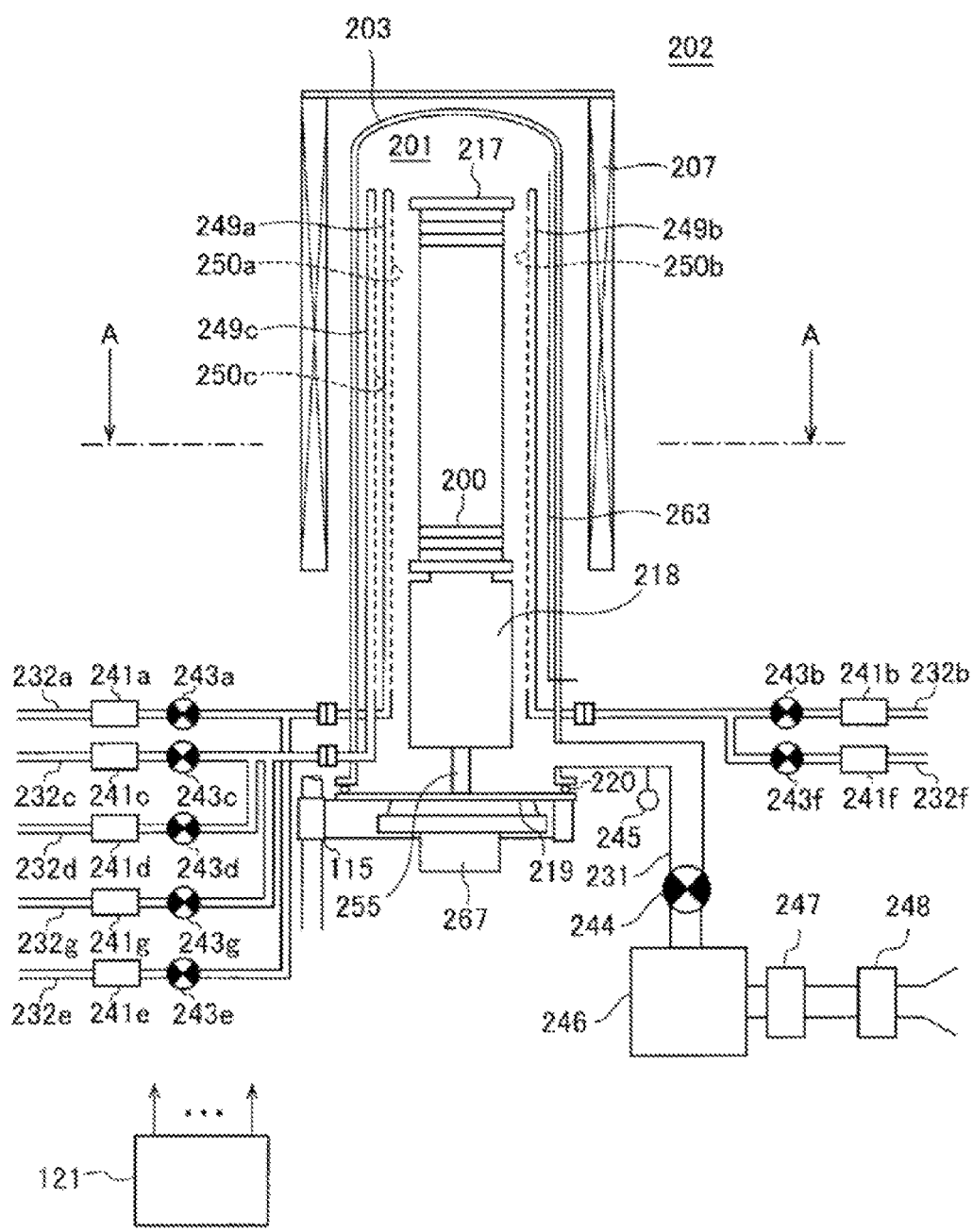
FIG. 1 is a schematic view illustrating a configuration of a vertical treatment furnace of a substrate processing apparatus, in which a portion of the treatment furnace is shown by a longitudinal sectional view, according to some embodiments.

A back pressure of a vacuum pump disposed in an exhaust line may be increased when a film is formed on a substrate by performing a cycle a predetermined number of times, the cycle including supplying a raw material gas to the substrate in a process chamber, exhausting the raw material gas remaining in the process chamber through the exhaust line in a state where the supply of the raw material gas is being stopped, supplying an amine-based gas to the substrate in the process chamber, and exhausting the amine-based gas remaining in the process chamber through the exhaust line in a state where the supply of the amine-based gas is being stopped. Specifically, it has been confirmed that a considerable amount of reaction byproducts was adhered to a downstream side of the vacuum pump in the exhaust line, in particular in a portion between a trap device and a harm-removing device in the downstream side of the vacuum pump in the exhaust line and acted as the cause of increase in the back pressure of the vacuum pump.

In addition, the reaction byproducts may be produced by a reaction of the raw material gas remaining in the downstream side of the vacuum pump in the exhaust line, in particular in the portion between the trap device and the harm-removing device, with a large amount of the amine-based gas exhausted at one time in the process of exhausting the amine-based gas remaining in the process chamber. That is, it has been found that, although the process of exhausting the raw material gas remaining in the process chamber was performed after the process of supplying the raw material gas, as the raw material gas stayed in the downstream side of the vacuum pump of the exhaust line and a large amount of the amine-based gas was exhausted at one time in the process of exhausting the amine-based gas remaining in the process chamber after the process of supplying the amine-based gas, a large amount of reaction byproducts may be produced by the reaction of the stayed raw material gas with the large amount of the amine-based gas exhausted at one time. It also has been found that, with an increase in the amount of the amine-based gas exhaust per unit time, there was a tendency to raise a probability of reaction of the stayed raw material gas with the amine-based gas and an increase an amount of adhered reaction byproducts.

This effect is noticeable when a gas containing a halogen element, particularly a chlorine element was used for the raw material gas and an amine was used for the amine-based gas. It also has been found that, with an increase in the amount of amine-based gas exhaust per unit time, a probability of reaction of the stayed raw material gas with the amine-based gas was raised and an amount of produced reaction byproducts was increased, which is likely to block the exhaust line. It also has been found that the reaction byproducts contained an amine halide such as amine chloride or the like. It also has been confirmed that the effect of increase in the back pressure of the vacuum pump disappeared when the amine-based gas was replaced with $NH_3$ gas or $O_2$ gas which has a higher vapor pressure than the amine-based gas. In other words, the technical purpose of the present disclosure is to overcome the problems which occurred when the amine-based gas having a relatively low vapor pressure (i.e., having a lower vapor pressure than at least $NH_3$ gas and $O_2$ gas) was used.

Various embodiments will be now described with reference to the drawings.

<First Embodiment>

(1) Configuration of Substrate Processing Apparatus

Figure 2:
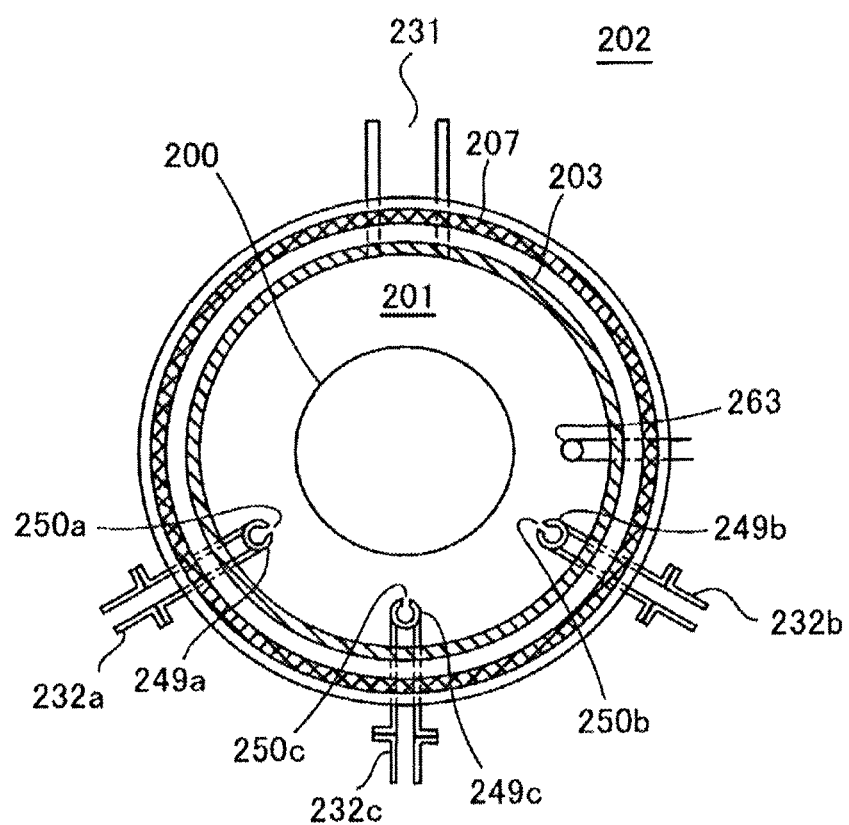
FIG. 2 is a schematic view illustrating a configuration of the vertical treatment furnace of the substrate processing apparatus, in which a portion of the treatment furnace is shown by a sectional view taken along line A-A in FIG. 1.

FIG. 1 is a schematic view illustrating a configuration of a vertical treatment furnace 202 of a substrate processing apparatus, according to some embodiments, in which a portion of the treatment furnace is shown by a longitudinal sectional view. FIG. 2 is a schematic view illustrating a configuration of the vertical treatment furnace 202 of the substrate processing apparatus, according to some embodiments, in which a portion of the treatment furnace is shown by a sectional view taken along line A-A in FIG. 1.

As shown in FIG. 1, the vertical treatment furnace 202 has a heater 207 as a heating member (heating mechanism). The heater 207 has a cylindrical shape and is supported by a heater base (not shown) as a support plate so as to be vertically arranged. The heater 207 acts as an activation mechanism to activate a gas with heat, as will be described later.

A reaction tube 203 forming a reaction vessel (process vessel) is disposed inside the heater 207 in a concentric form along the heater 207. The reaction tube 203 is made of a heat resistant material such as, for example, quartz ($SiO_2$), silicon carbide (SiC) or the like and has a cylindrical shape with its upper end closed and its lower end opened. A process chamber 201 is formed in a hollow of the reaction tube 203 and is configured to accommodate wafers 200. The wafers 200 are horizontally stacked in multiple stages to be aligned in a vertical direction in a boat 217 which will be described later.

A first nozzle 249a, a second nozzle 249b and a third nozzle 249c are disposed to penetrate through a lower side of the reaction tube 203. The first nozzle 249a, the second nozzle 249b and the third nozzle 249c are respectively connected to a first gas supply pipe 232a, a second gas supply pipe 232b and a third gas supply pipe 232c. Additionally, a fourth gas supply pipe 232d is connected to the third gas supply pipe 232c. In this way, the three nozzles 249a, 249b and 249c and the four gas supply pipes 232a, 232b, 232c and 232d are provided in the reaction tube 203 to allow several kinds of (4 in this example) gases to be supplied into the process chamber 201.

An exhaust pipe 231 is disposed at a lower portion of the reaction tube 203. In addition, a metal manifold (not shown) to support the reaction tube 203 may be disposed below the reaction tube 203 and the nozzles 249a, 249b and 249c may be disposed to penetrate through a side wall of the metal manifold. In this case, the exhaust pipe 231 may be disposed at the metal manifold, rather than the lower portion of the reaction tube 203.

A mass flow controller (MFC) 241a as a flow rate controller (a flow rate control unit) and an opening/closing valve 243a are disposed in the first gas supply pipe 232a in this order from the upstream direction. In addition, a first inert gas supply pipe 232e is connected to the downstream side of the valve 243a of the first gas supply pipe 232a. A mass flow controller (MFC) 241e as a flow rate controller (a flow rate control unit) and an opening/closing valve 243e are disposed in the first inert gas supply pipe 232e in this order from the upstream direction. In addition, the above-mentioned first nozzle 249a is connected to a leading end of the first gas supply pipe 232a. The first nozzle 249a is vertically disposed along an inner wall of the reaction tube 203 in a circular arc-shaped space between the inner wall of the reaction tube 203 and the wafers 200. The first nozzle 249a is disposed in a flank of a wafer arrangement region where the wafers 200 are arranged. The first nozzle 249a is configured as an L-like long nozzle and has its horizontal portion disposed to penetrate through the lower side wall of the reaction tube 203 and its vertical portion disposed to rise from at least one end of the wafer arrangement region toward the other end thereof. A plurality of gas supply holes 250a through which gas is supplied is disposed at a side surface of the first nozzle 249a. The gas supply holes 250a are opened toward a center of the reaction tube 203. The gas supply holes 250a are disposed to span from the bottom to top of the reaction tube 203 at a predetermined opening pitch. Each of the gas supply holes 250a has the same opening area. A first gas supply system is mainly constituted by the first gas supply pipe 232a, the mass flow controller 241a, the valve 243a and the first nozzle 249a. In addition, a first inert gas supply system is mainly constituted by the first inert gas supply pipe 232e, the mass flow controller 241e and the valve 243e.

A mass flow controller (MFC) 241b as a flow rate controller (a flow rate control unit) and an opening/closing valve 243b are disposed in the second gas supply pipe 232b in this order from the upstream direction. In addition, a second inert gas supply pipe 232f is connected to the downstream side of the valve 243b of the second gas supply pipe 232b. A mass flow controller (MFC) 241f as a flow rate controller (a flow rate control unit) and an opening/closing valve 243f are disposed in the second inert gas supply pipe 232f in this order from the upstream direction. In addition, the above-mentioned second nozzle 249b is connected to a leading end of the second gas supply pipe 232b. The second nozzle 249b is vertically disposed along the inner wall of the reaction tube 203 in the circular arc-shaped space between the inner wall of the reaction tube 203 and the wafers 200. The second nozzle 249b is disposed in the flank of the wafer arrangement region where the wafers 200 are arranged. The second nozzle 249b is configured as an L-like long nozzle and has its horizontal portion disposed to penetrate through the lower side wall of the reaction tube 203 and its vertical portion disposed to rise from at least one end of the wafer arrangement region toward the other end thereof. A plurality of gas supply holes 250b through which gas is supplied is disposed at a side surface of the second nozzle 249b. The gas supply holes 250b are opened toward the center of the reaction tube 203. The gas supply holes 250b are disposed to span from the bottom to top of the reaction tube 203 at a predetermined opening pitch. Each of the gas supply holes 250b has the same opening area. A second gas supply system is mainly constituted by the second gas supply pipe 232b, the mass flow controller 241b, the valve 243b and the second nozzle 249b. In addition, a second inert gas supply system is mainly constituted by the second inert gas supply pipe 232f, the mass flow controller 241f and the valve 243f.

A mass flow controller (MFC) 241c as a flow rate controller (a flow rate control unit) and an opening/closing valve 243c are disposed in the third gas supply pipe 232c in this order from the upstream direction. In addition, a fourth gas supply pipe 232d is connected to the downstream side of the valve 243c of the third gas supply pipe 232c. A mass flow controller 241d as a flow rate controller (a flow rate control unit) and an opening/closing valve 243d are disposed in the fourth gas supply pipe 232d in this order from the upstream direction. In addition, a third inert gas supply pipe 232g is connected to the downstream side of a connection position of the third gas supply pipe 232c to the fourth gas supply pipe 232d. A mass flow controller 241g as a flow rate controller (a flow rate control unit) and an opening/closing valve 243g are disposed in the third inert gas supply pipe 232g in this order from the upstream direction. In addition, the above-mentioned third nozzle 249c is connected to a leading end of the third gas supply pipe 232c. The third nozzle 249c is vertically disposed along the inner wall of the reaction tube 203 in the circular arc-shaped space between the inner wall of the reaction tube 203 and the wafers 200. The third nozzle 249c is disposed in the flank of the wafer arrangement region where the wafers 200 are arranged. The third nozzle 249c is configured as an L-like long nozzle and has its horizontal portion disposed to penetrate through the lower side wall of the reaction tube 203 and its vertical portion disposed to rise from at least one end of the wafer arrangement region toward the other end thereof. A plurality of gas supply holes 250c through which gas is supplied is disposed in a side surface of the third nozzle 249c. The gas supply holes 250c are opened toward the center of the reaction tube 203. The gas supply holes 250c are disposed to span from the bottom to top of the reaction tube 203 at a predetermined opening pitch. Each of the gas supply holes 250c has the same opening area. A third gas supply system is mainly constituted by the third gas supply pipe 232c, the mass flow controller 241c, the valve 243c and the third nozzle 249c. In addition, a fourth gas supply system is mainly constituted by the fourth gas supply pipe 232d, the mass flow controller 241d, the valve 243d and the third nozzle 249c. In addition, a third inert gas supply system is mainly constituted by the third inert gas supply pipe 232g, the mass flow controller 241g and the valve 243g.

In the gas supply systems, gas is transferred via the nozzles 249a, 249b and 249c arranged in the circular arc-shaped longitudinal space defined by the inner wall of the reaction tube 203 and ends of the plurality of loaded wafers 200, and supplied into the reaction tube 203 near the wafers 200 from the gas supply holes 250a, 250b and 250c opened in the nozzles 249a, 249b and 249c, respectively. The gas supplied into the reaction tube 203 mainly flows in a horizontal direction, that is, a direction in parallel to the surface of the wafers 200 in the reaction tube 203. This configuration provides an advantage of uniformly supplying the gas to the wafers 200 and forming a uniform thickness of a film on the wafers 200. Although a residual gas after the reaction flows toward the exhaust mechanism, that is, the exhaust pipe 231, a direction of flow of the residual gas is specified by a position of the exhaust mechanism without being limited to the vertical direction.

A raw material gas containing a halogen element and another element, for example, a chlorosilane-based raw material gas containing at least a silicon (Si) element and a chlorine (Cl) element, is supplied from the first gas supply pipe 232a into the process chamber 201 via the mass flow controller 241a, the valve 243a and the first nozzle 249a. As used herein, the chlorosilane-based raw material gas refers to silane-based gas containing a chloro group as a halogen group. In this example, hexachlorodisilane ($Si_2Cl_6$, or HCDS) gas may be used as the chlorosilane-based raw material gas. Since the HCDS is in a liquid state at room temperature and atmospheric pressure, the liquefied HCDS may be supplied as HCDS gas after being vaporized by a vaporizing system (not shown) such as a vaporizer or a bubbler.

A reaction gas (first reaction gas), for example, an amine-based gas containing a carbon (C) element and a nitrogen (N) element, is supplied from the second gas supply pipe 232b into the process chamber 201 via the mass flow controller 241b, the valve 243b and the second nozzle 249b. The amine-based gas may include amines such as ethyl amine, methyl amine, propyl amine, isopropyl amine, butyl amine and so on. As used herein, amine is a generic term of compounds having a hydrocarbon group such as an alkyl group or the like, substituting a hydrogen atom of ammonia ($NH_3$). That is, amines contain a hydrocarbon group such as an alkyl group or the like. As used herein, the amine-based gas refers to a gas having an amine group, such as a gas with an evaporated amine, and is only composed of three elements, a carbon (C) element, a nitrogen (N) element and a hydrogen (H) element constituting an amine group. That is, the amine-based gas is a gas which does not contain a silicon element and a metal element. In this example, a triethylamine (($C_2H_5)_3N$, TEA) gas may be used as the amine-based raw material gas. Since the TEA is in a liquid state at room temperature and atmospheric pressure, the liquefied TEA may be supplied as a TEA gas after being vaporized by a vaporizing system (not shown) such as a vaporizer or a bubbler.

Another reaction gas (second reaction gas), for example, a gas containing oxygen (O) (oxygen-containing gas), is supplied from the third gas supply pipe 232c into the process chamber 201 via the mass flow controller 241c, the valve 243c and the third nozzle 249c. In this example, an oxygen ($O_2$) gas may be used as the oxygen-containing gas.

Another reaction gas (second reaction gas), for example, a gas containing nitrogen (N) (nitrogen-containing gas), is supplied from the fourth gas supply pipe 232d into the process chamber 201 via the mass flow controller 241d, the valve 243d, the third gas supply pipe 232c and the third nozzle 249c. In this example, an ammonia ($NH_3$) gas may be used as the nitrogen-containing gas.

A nitrogen ($N_2$) gas is supplied from the inert gas supply pipes 232e, 232f and 232g into the process chamber 201 via the mass flow controllers 241e, 241f and 241g, the valves 243e, 243f and 243g, the gas supply pipes 232a, 232b, and 232c and the nozzles 249a, 249b and 249c, respectively.

For example, when the gases are flown from the gas supply pipes as described above, a raw material gas supply system, i.e., a chlorosilane-based raw material gas supply system, is constituted by the first gas supply system, a reaction gas supply system (first reaction gas supply system), i.e., an amine-based gas supply system, is constituted by the second gas supply system, a reaction gas supply system (second reaction gas supply system), i.e., an oxygen-containing gas supply system, is constituted by the third gas supply system, and a reaction gas supply system (second reaction gas supply system), i.e., a nitrogen-containing gas supply system, is constituted by the fourth gas supply system.

The exhaust pipe 231 to exhaust the internal atmosphere of the process chamber 201 is disposed in the reaction tube 203. As shown in FIG. 2, when viewed from a cross section (along line A-A in FIG. 1), the exhaust pipe 231 is disposed in a position opposite to a position where the gas supply holes 250a of the first nozzle 249a, the gas supply holes 250b of the second nozzle 249b and the gas supply holes 250c of the third nozzle 249c of the reaction tube 203 are disposed, that is, a position opposite to the gas supply holes 250a, 250b and 250c with the wafers 200 interposed therebetween. In addition, as shown in FIG. 1, when viewed from a longitudinal section, the exhaust pipe 231 is disposed below a position where the gas supply holes 250a, 250b and 250c are disposed. With this configuration, gas supplied from the gas supply holes 250a, 250b and 250c to the neighborhood of the wafers 200 in the process chamber 201 flows in a horizontal direction, that is, a direction in parallel to surfaces of the wafers 200, flows downward, and then is exhausted out of the exhaust pipe 231. The main flow of gas in the process chamber 201 becomes a flow in the horizontal direction, as described previously.

The exhaust pipe 231 is connected with a pressure sensor (pressure detecting part) 245 for detecting the internal pressure of the process chamber 201, an APC (Auto Pressure Controller) valve 244 as an exhaust valve formed as a pressure regulator (pressure regulating part), a vacuum pump 246 as a vacuum exhaust device, a trap device 247 for trapping reaction by-products, unreacted raw material gas and so on in exhaust gases, and a harm-removing device 248 for removing corrosive ingredients, toxic ingredients and so on contained in the exhaust gases. An exhaust system, i.e., an exhaust line, is mainly constituted through the exhaust pipe 231, the APC valve 244 and the pressure sensor 245. The vacuum pump 246, the trap device 247 and the harm-removing device 248 may be also considered to be included in the exhaust system.

The APC valve 244 is a valve configured to perform/stop vacuum exhaust in the process chamber 201 by opening/closing the valve with the vacuum pump 246 actuated and adjust the internal pressure of the process chamber 201 by regulating a degree of valve opening with the vacuum pump 246 actuated. In other words, the exhaust system is configured to approach the "actual internal pressure" of the process chamber 201 to a predetermined "set pressure" by regulating the degree of valve opening of the APC valve 244 based on pressure information detected by the pressure sensor 245 while actuating the vacuum pump 246. For example, when there is no change in a flow rate of a gas supplied into the process chamber 201 or supply of the gas into the process chamber 201 is stopped, the actual internal pressure of the process chamber 201 may be adjusted by changing the set internal pressure of the process chamber 201 and changing the degree of valve opening the APC valve 244 according to the set internal pressure. As a result, exhaust capability of the exhaust line is changed and the actual internal pressure of the process chamber 201 slowly (gradually) approaches the set pressure. In this manner, the "set internal pressure" of the process chamber 201 can be considered to be equal to a "target pressure" at the time when control of the internal pressure of the process chamber 201 is carried out, and the "actual internal pressure" of the process chamber 201 follows the target pressure. The phrase "the set internal pressure of the process chamber 201 is changed" has substantially the same meaning as "the degree of valve opening of the APC valve 244 is changed to change the exhaust capability of the exhaust line", and may be considered as a "command to change the degree of valve opening of the APC valve 244".

A seal cap 219, which functions as a furnace opening cover for air-tightly blocking the bottom opening of the reaction tube 203, is disposed below the reaction tube 203. The seal cap 219 is configured to contact the bottom of the reaction tube 203 from below in the vertical direction. The seal cap 219 is made of, for example, metal such as stainless steel or the like and has a disc shape. An O-ring 220 as a seal member contacting the bottom of the reaction tube 203 is disposed in the top side of the seal cap 219. A rotation mechanism 267 to rotate the boat 217 as a substrate support, which will be described later, is disposed below the seal cap 219. A shaft 255 of the rotation mechanism 267 is connected to the boat 217 through the seal cap 219. The rotation mechanism 267 is configured to rotate the wafers 200 by rotating the boat 217. The seal cap 219 is configured to be vertically elevated or lowered by a boat elevator 115 as an elevation mechanism vertically disposed outside the reaction tube 203. The boat elevator 115 is configured to carry the boat 217 into or out of the process chamber 201 by elevating or lowering the seal cap 219. That is, the boat elevator 115 is configured as a transfer device (transfer mechanism) to transfer the boat 217, i.e., the wafers 200, into or out of the process chamber 201.

The boat 217, which is utilized as the substrate support, is made of, for example, a heat resistant material such as quartz, silicon carbide or the like and is configured to support the wafers 200 horizontally stacked in multiple stages with the center of the wafers 200 concentrically aligned. In addition, a heat insulating member 218 made of, for example, a heat resistant material such as quartz, silicon carbide or the like, is disposed below the boat 217 and is configured to make it difficult for heat from the heater 207 to be transferred to the seal cap 219. The heat insulating member 218 may be constituted by a plurality of heat insulating plates, each made of a heat resistant material such as quartz, silicon carbide or the like, and a heat insulating plate holder to support these heat insulating plates horizontally in multiple stages.

A temperature sensor 263 as a temperature detector is disposed within the reaction tube 203. Based on temperature information detected by the temperature sensor 263, a state of electric conduction to the heater 207 is adjusted such that the interior of the process chamber 201 has an intended temperature distribution. The temperature sensor 263 has an L-like shape, like the nozzles 249a, 249b and 249c and is disposed along the inner wall of the reaction tube 203.

Figure 3:
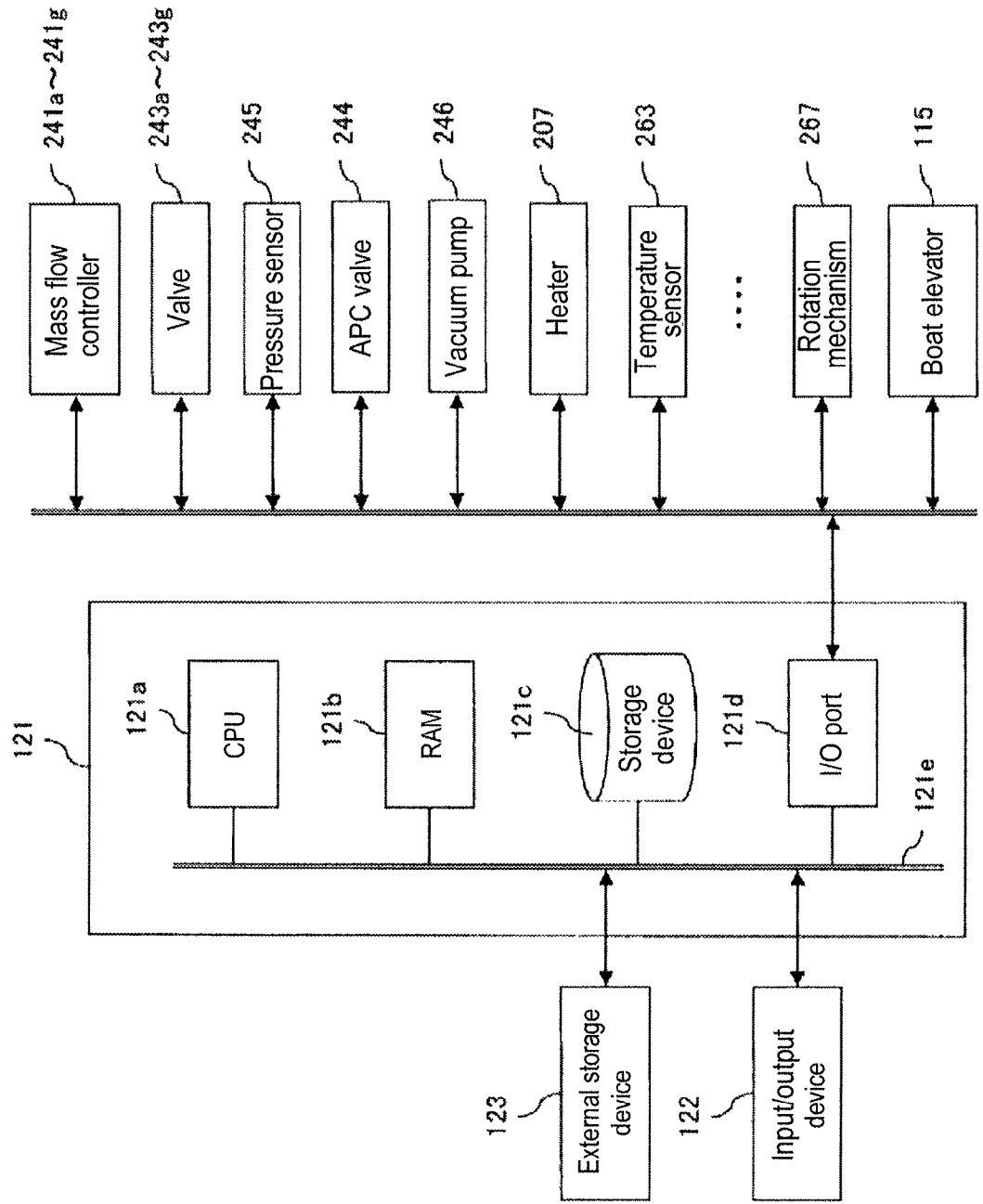
FIG. 3 is a schematic view illustrating a configuration of a controller of the substrate processing apparatus, according to some embodiments.

FIG. 3 is a schematic view illustrating a configuration of a controller of the substrate processing apparatus, according to some embodiments. As shown in FIG. 3, a controller 121 as a control unit (control means) is constituted by a computer including a CPU (Central Processing Unit) 121a, a RAM (Random Access Memory) 121b, a storage device 121c and an I/O port 121d. The RAM 121b, the storage device 121c and the I/O port 121d are configured to exchange data with the CPU 121a via an internal bus 121e. An input/output device 122 constituted by, for example, a touch panel or the like is connected to the controller 121.

The storage device 121c is constituted by, for example, a flash memory, a HDD (Hard Disk Drive) or the like. Control programs to control an operation of the substrate processing apparatus and process recipes describing substrate processing procedures and conditions, which will be described later, are readably stored in the storage device 121c. The process recipes function as programs to cause the controller 121 to execute procedures in substrate processing which will be described later. Hereinafter, these process recipes and control programs are collectively simply referred to as programs. As used herein, the term "programs" may be intended to include process recipes only, control programs only, or both thereof. The RAM 121b is configured as a memory area (work area) in which programs and data read by the CPU 121a are temporarily stored.

The I/O port 121d is connected to the above-mentioned mass flow controllers 241a, 241b, 241c, 241d, 241e, 241f and 241g, valves 243a, 243b, 243c, 243d, 243e, 243f and 243g, pressure sensor 245, APC valve 244, vacuum pump 246, heater 207, temperature sensor 263, rotation mechanism 267, boat elevator 115 and so on.

The CPU 121a is configured to read and execute a control program from the storage device 121c and read a process recipe from the storage device 121c according to an operation command input from the input/output device 122. The CPU 121a is further configured to control a flow rate adjustment operation of various gases by the mass flow controllers 241a, 241b, 241c, 241d, 241e, 241f and 241g, an opening/closing operation of the valves 243a, 243b, 243c, 243d, 243e, 243f and 243g, an opening/closing operation of the APC valve 244, a pressure adjustment operation by the APC valve 244 based on the pressure sensor 245, a temperature adjustment operation of the heater 207 based on the temperature sensor 263, start and stop of the vacuum pump 246, rotation and a rotation speed adjustment operation of the boat 217 by the rotation mechanism 267, an elevation operation by the boat elevator 115, etc., according to contents of the read process recipe.

The controller 121 may be configured as a general-purpose computer without being limited to a dedicated computer. For example, in the embodiment, the controller 121 may be configured by preparing an external storage device (for example, a magnetic tape, a magnetic disk such as a flexible disk or a hard disk, an optical disk such as CD or DVD, a magneto-optical disk such as MO, and a semiconductor memory such as a USB memory or a memory card) 123 which stores the above-described programs and installing the programs from the external storage device 123 into the general-purpose computer. A means for providing the programs for the computer is not limited to the case where the programs are provided through the external storage device 123. For example, the programs may be provided using a communication means such as Internet, a dedicated line or the like, without the external storage device 123. The storage device 121c and the external storage device 123 are implemented with a computer readable recording medium and will be hereinafter collectively simply referred to as a recording medium. The term "recording medium" may include the storage device 121c only, the external storage device 123 only, or both thereof.

(2) Substrate Processing Method

As one of processes of manufacturing a semiconductor device using the vertical treatment furnace 202 of the above-described substrate processing apparatus, an example of sequence of forming a film on the wafer 200 will be now described. In the following description, operations of various components constituting the substrate processing apparatus are controlled by the controller 121.

In this embodiment, a film is formed on the wafer 200 by performing a cycle including a process of supplying a raw material gas for the wafer 200 in the process chamber 201, exhausting the raw material gas remaining in the process chamber 201 by means of the exhaust line under a state where the supply of the raw material gas is stopped , supplying an amine-based gas for the wafer 200 in the process chamber 201, and exhausting the amine-based gas remaining in the process chamber 201 by means of the exhaust line, by a predetermined number of times.

More specifically, a film having a predetermined composition including predetermined elements and a predetermined thickness is formed on the wafer 200 by performing a cycle including a process of forming a predetermined element-containing layer on the wafer 200 by supplying a raw material gas to the heated wafer 200 in the process chamber 201, exhausting the raw material gas remaining in the process chamber 201 by means of the exhaust line under a state where the supply of the raw material gas is stopped , modifying the predetermined element-containing layer to form a first layer containing predetermined elements, nitrogen and carbon by supplying an amine-based gas to the heated wafer 200 in the process chamber 201, exhausting the amine-based gas remaining in the process chamber 201 by means of the exhaust line under a state where the supply of the amine-based gas is stopped, modifying the first layer to form a second layer by supplying a reaction gas different from the raw material gas and the amine-based gas to the heated wafer 200 in the process chamber 201, and an exhausting the reaction gas remaining in the process chamber 201 by means of the exhaust line under a state where the supply of the reaction gas is stopped, by a predetermined number of times (once or more).

In addition, under the state where the supply of the amine-based gas is stopped, the degree of valve opening of the APC valve 244 disposed in the exhaust line is changed in multiple stages in the act of exhausting the amine-based gas remaining in the process chamber 201. More specifically, the act exhausting the amine-based gas remaining in the process chamber 201 includes a process of exhausting the amine-based gas remaining in the process chamber 201 with the degree of valve opening of the APC valve 244 as a first degree of valve opening and a process of exhausting the amine-based gas remaining in the process chamber 201 with the degree of valve opening of the APC valve 244 as a second degree of valve opening which is larger than the first degree of valve opening.

In other words, under the state where the supply of the amine-based gas is stopped, the exhaust capability through the exhaust line is changed in multiple stages in the act of exhausting the amine-based gas remaining in the process chamber 201. More specifically, the act of exhausting the amine-based gas remaining in the process chamber 201 includes a process of exhausting the amine-based gas remaining in the process chamber 201 with the exhaust capability through the exhaust line as a first exhaust capability and a process of exhausting the amine-based gas remaining in the process chamber 201 with the exhaust capability through the exhaust line as a second exhaust capability which is larger than the first exhaust capability.

Alternatively, under the state where the supply of the amine-based gas is stopped, the set internal pressure of the process chamber 201 is changed in multiple stages in the act of exhausting the amine-based gas remaining in the process chamber 201. More specifically, the act of exhausting the amine-based gas remaining in the process chamber 201 includes a process of exhausting the amine-based gas remaining in the process chamber 201 with the set internal pressure of the process chamber 201 as a first set internal pressure and a process of exhausting the amine-based gas remaining in the process chamber 201 with the set internal pressure of the process chamber 201 as a second set internal pressure which is larger than the first set internal pressure.

For example, plural kinds of gases containing plural elements constituting a film to be formed are simultaneously supplied in a conventional CVD (Chemical Vapor Deposition) method and plural kinds of gases containing plural elements constituting a film to be formed are alternately supplied in a conventional ALD (Atomic Layer Deposition) method. A $SiO_2$ film or a $Si_3N_4$ film is formed by controlling supply conditions such as a flow rate of gas supply, gas supply time, process temperature and the like. In these techniques, the supply conditions are controlled such that a film stoichiometric composition ratio (O/Si) for the $SiO_2$ film is approximately equal to two and a film stoichiometric composition ratio (N/Si) for the $Si_3N_4$ film approximately equal to 1.33.

In contrast, in this embodiment, the supply conditions are controlled such that a film to be formed has a stoichiometric composition ratio or a composition ratio different from the stoichiometric composition ratio. For example, the supply conditions are controlled such that at least one of plural elements constituting a film to be formed is supplied in excess of other elements in terms of a stoichiometric composition. An example of forming a film while controlling a film composition ratio which represents a ratio between plural elements constituting the film will be described below.

Figure 4:
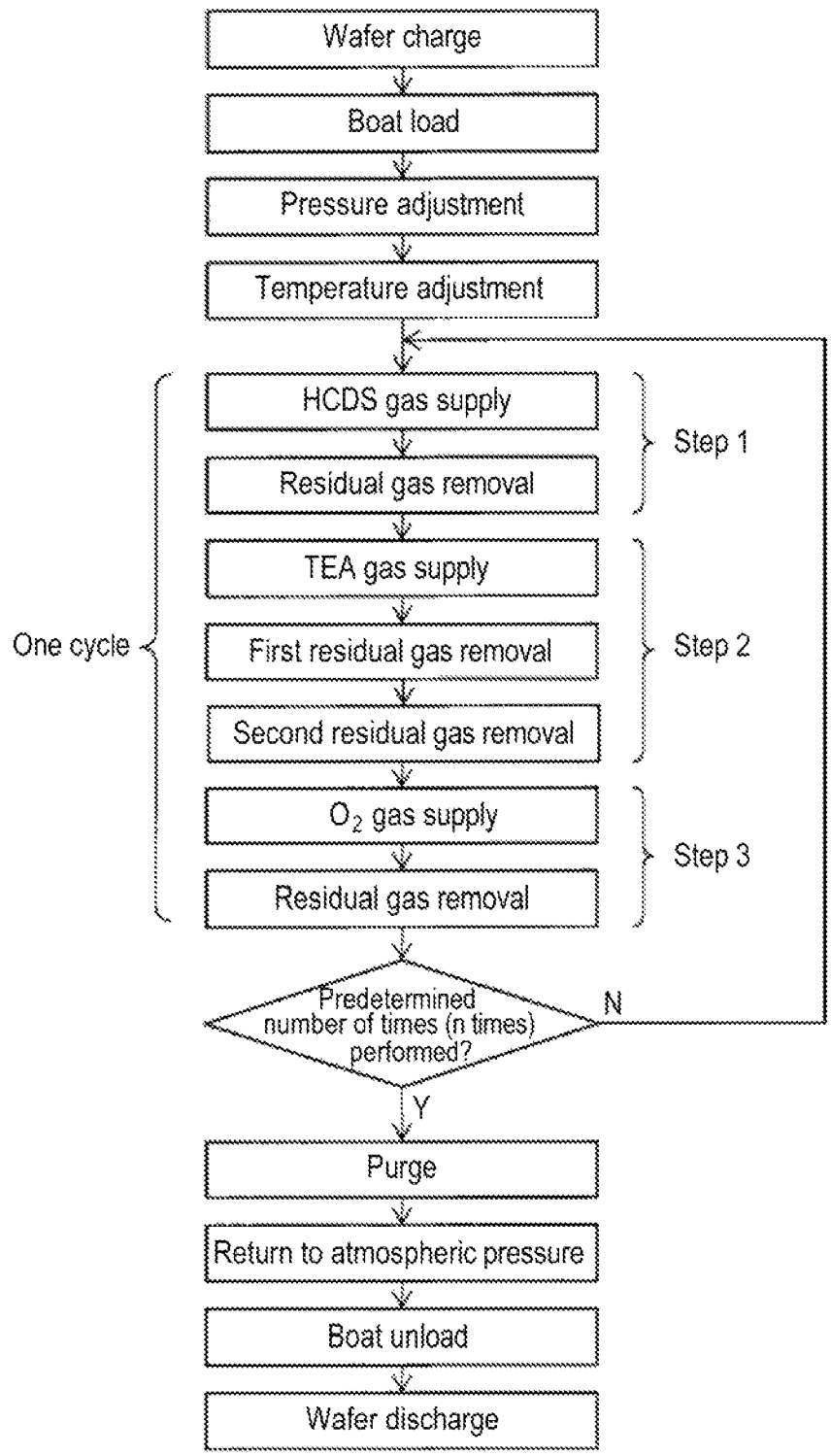
FIG. 4 is a flow chart illustrating a flow of film formation according to a first embodiment.
Figure 5:
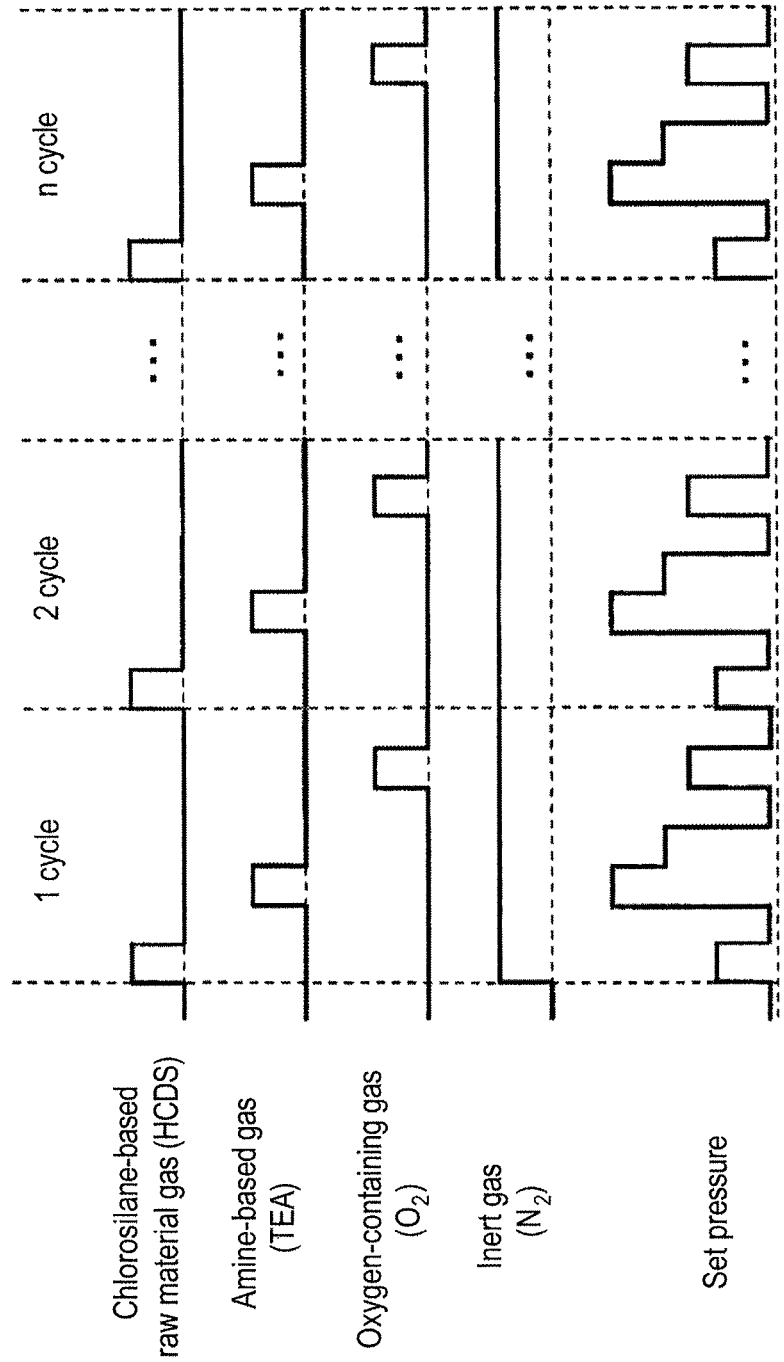
FIG. 5 is a timing diagram of gas being supplied in a film forming sequence of the first embodiment.

A film forming sequence according to this embodiment will be now described with reference to FIGS. 4 and 5. FIG. 4 is a view illustrating a film forming flow according to this embodiment. FIG. 5 is a view illustrating timings of gas supply in a film forming sequence according to this embodiment. An example of forming a silicon oxycarbonitride film (SiOCN film) or a silicon oxycarbide film (SiOC film), which is a silicon-based insulating film having a predetermined composition and a predetermined thickness, on the wafer 200 by performing a cycle including a process of forming a silicon-containing layer on the wafer 200 by supplying an HCDS gas as a raw material gas to the heated wafer 200 in the process chamber 201, exhausting the HCDS gas remaining in the process chamber 201 by means of the exhaust line under a state where the supply of the HCDS gas is stopped , modifying the silicon-containing layer to form a first layer containing silicon, nitrogen and carbon by supplying a TEA gas, which is an amine-based gas, to the heated wafer 200 in the process chamber 201, exhausting the TEA gas remaining in the process chamber 201 by means of the exhaust line under a state where the supply of the TEA gas is stopped, modifying the first layer to form a silicon oxycarbonitride film (SiOCN film) or a silicon oxycarbide film (SiOC film) as a second layer by supplying an $O_2$ gas, which is an oxygen-containing gas, as a reaction gas different from the raw material gas and the amine-based gas to the heated wafer 200 in the process chamber 201, and exhausting the $O_2$ gas remaining in the process chamber 201 by means of the exhaust line under a state where the supply of the $O_2$ gas is stopped, by a predetermined number of times (n times).

<Wafer Charge and Boat Load>

When a plurality of wafers 200 is loaded on the boat 217 (wafer charge), the boat 217 supporting the plurality of wafers 200 is lifted and loaded into the process chamber 201 by the boat elevator 115 (boat load). In this state, the seal cap 219 seals the bottom of the reaction tube 203 via the Oring 220.

<Pressure Adjustment and Temperature Adjustment>

The interior of the process chamber 201 is vacuum-exhausted by the vacuum pump 246 to set the interior to a desired pressure (degree of vacuum). At this time, the internal pressure of the process chamber 201 is measured by the pressure sensor 245 and the APC valve 244 is feedback-controlled based on the measured pressure information (pressure adjustment). The vacuum pump 246 remains activated at least until the wafers 200 are completely processed. The interior of the process chamber 201 is heated by the heater 207 to set the interior to a desired temperature. At this time, a state of electric conduction to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 continues at least until the wafers 200 are completely processed. Subsequently, the boat 217 and the wafers 200 begin to be rotated by the rotation mechanism 267. The rotation of the boat 217 and the wafers 200 by the rotation mechanism 267 continues at least until the wafers 200 are completely processed.

<Process of forming silicon oxycarbonitride Film or silicon oxycarbide film>

Thereafter, the following three steps (Steps 1 to 3) are sequentially performed.

<Step 1>
<HCDS Gas Supply>

The valve 243a of the first gas supply pipe 232a is opened to flow an HCDS gas into the first gas supply pipe 232a. A flow rate of the HCDS gas flowing into the first gas supply pipe 232a is regulated by the mass flow controller 241a. The HCDS gas with its flow rate regulated is supplied from the gas supply holes 250a of the first nozzle 249a into the process chamber 201 and is exhausted from the exhaust pipe 231. At this time, the HCDS gas is supplied to the wafers 200. At the same time, the valve 243e is opened to flow an inert gas such as an $N_2$ gas or the like into the first inert gas supply pipe 232e. A flow rate of the $N_2$ gas flowing into the first inert gas supply pipe 232e is regulated by the mass flow controller 241e. The $N_2$ gas with its flow rate regulated is supplied into the process chamber 201, along with the HCDS gas, and is exhausted from the exhaust pipe 231. At this time, in order to prevent the HCDS gas from being introduced into the second nozzle 249b and the third nozzle 249c, the valves 243f and 243g are opened to flow the $N_2$ gas into the second inert gas supply pipe 232f and the third inert gas supply pipe 232g. The $N_2$ gas is supplied into the process chamber 201 via the second gas supply pipe 232b, the third gas supply pipe 232c, the second nozzle 249b and the third nozzle 249c and is exhausted from the exhaust pipe 231.

At this time, the APC valve 244 is appropriately regulated to set the internal pressure of the process chamber 201 to fall within a range of, for example, 1 to 13300 Pa, preferably 20 to 1330 Pa. The flow rate of the HCDS gas controlled by the mass flow controller 241a is set to fall within a range of, for example, 1 to 1000 sccm. The flow rates of the $N_2$ gases controlled by the mass flow controllers 241e, 241f and 241g are set to fall within a range of, for example, 100 to 10000 sccm. Time period during which the HCDS gas is supplied to the wafers 200, that is, gas supply time (irradiation time), is set to fall within a range of, for example, 1 to 120 seconds, preferably 1 to 60 seconds. At this time, the heater 207 is set to a temperature such that the temperature of the wafers 200 is set to fall within a range of, for example, 250 to 700 degrees C., preferably 350 to 650 degrees C. If the temperature of the wafers 200 is less than 250 degrees C., it becomes difficult for HCDS to be chemisorbed onto the wafers 200, which may result in difficulty in obtaining a practical film forming rate. This problem can be overcome by setting the temperature of the wafers 200 to 250 degrees C. or higher.

If the temperature of the wafers 200 is set to 350 degrees C. or higher, HCDS can be more sufficiently adsorbed onto the wafers 200, which may result in a higher film forming rate. If the temperature of the wafers 200 exceeds 700 degrees C., a CVD reaction is strengthened (i.e., a gas phase reaction becomes dominant), which may result in deteriorated uniformity of film thickness and difficulty in control thereof. When the temperature of the wafers 200 is 700 degrees C. or lower, it is possible to suppress such deterioration of the uniformity of film thickness and avoid difficulty in control thereof. In particular, when the temperature of the wafers 200 is 650 degrees C. or lower, a surface reaction becomes dominant, which facilitates secure of the uniformity of film thickness and control thereof. Thus, in some embodiments, the temperature of the wafers 200 will mainly fall within a range of 250 to 700 degrees C., preferably 350 to 650 degrees C.

The supply of the HCDS gas results in formation of a silicon-containing layer having a thickness of, for example, less than one atomic layer to several atomic layers on the wafers 200. The silicon-containing layer may be a HCDS gas adsorption layer or a silicon layer or both thereof. In this example, the silicon-containing layer may be a layer which contains silicon (Si) and chlorine (Cl). In this example, the silicon layer is the generic term including a continuous layer made of silicon (Si), a discontinuous layer, or a silicon thin film composed of a combination of these continuous and discontinuous layers. The continuous layer made of Si is sometimes referred to as a silicon thin film. Si of which the silicon layer is made includes one which is not completely decoupled from Cl. The HCDS gas adsorption layer includes a HCDS gas molecule continuous chemical adsorption layer and a HCDS gas molecule discontinuous chemical adsorption layer. That is, the HCDS gas chemical adsorption layer includes a chemical adsorption layer having a thickness of one molecular layer or less constituted by HCDS molecules. The HCDS ($Si_2Cl_6$) molecules constituting the HCDS gas chemical adsorption layer include those ($Si_xCl_y$ molecules) in which Si is partially decoupled from Cl. That is, the HCDS chemical adsorption layer includes $Si_2Cl_6$ molecule and/or $Si_xCl_y$ continuous and discontinuous chemical adsorption layers. As used herein, the phrase "layer having a thickness of less than one atomic layer" means an atomic layer discontinuously formed and the phrase "layer having a thickness of one atomic layer" means an atomic layer continuously formed. Similarly, the phrase "layer having a thickness of less than one molecular layer" means a molecular layer discontinuously formed and the phrase "layer having a thickness of one molecular layer" means a molecular layer continuously formed. Under the condition where the HCDS gas is self-decomposed (pyrolyzed), that is, under the condition where a pyrolytic reaction of the HCDS gas occurred, Si is deposited on the wafers 200, thereby forming the silicon layer. Under the condition where the HCDS gas is not self-decomposed (pyrolyzed), that is, under the condition where no pyrolytic reaction of the HCDS gas occurred, the HCDS gas is chemically adsorbed and deposited on the wafers 200, thereby forming the HCDS gas chemical adsorption layer. Forming the silicon layer on the wafers 200 can advantageously provide a higher film formation rate than forming the HCDS gas adsorption layer on the wafers 200. If the thickness of the silicon-containing layer formed on the wafers 200 exceeds several atomic layers, modification reaction in Steps 2 and 3, which will be described later, may not be applied to the entire silicon-containing layer. The minimum of thickness of the silicon-containing layer which can be formed on the wafers 200 is less than one atomic layer. Accordingly, the thickness of the silicon-containing layer may be set to fall within a range of less than one atomic layer to several atomic layers. When the thickness of the silicon-containing layer is not less than one atomic layer, i.e., one atomic layer or less, modification reaction in Steps 2 and 3, which will be described later, can be relatively expedited and time required for the modification reaction in Steps 2 and 3 can be shortened. Time required for the formation of the silicon-containing layer in Step 1 can be also shortened. As a result, processing time per cycle and hence total processing time can be shortened. In other words, a film formation rate can be increased. In addition, when the thickness of the silicon-containing layer is not less than one atomic layer, controllability for uniform film thickness can be improved.

<Residual Gas Removal>

After the silicon-containing layer is formed, the valve 243a of the first gas supply pipe 232a is closed to stop the supply of the HCDS gas. At this time, with the APC valve 244 of the exhaust pipe 231 opened, the interior of the process chamber 201 is vacuum-exhausted by the vacuum pump 246 and unreacted HCDS gas remaining in the process chamber 201 or HCDS gas which remains after contributing to the formation of the titanium-containing layer is excluded from the process chamber 201. At this time, with the valves 243e, 243f and 243g opened, the supply of the $N_2$ gas, as an inert gas, into the process chamber 201 is maintained. The $N_2$ gas acts as a purge gas, which is capable of further improving the effect of excluding the unreacted HCDS gas remaining in the process chamber 201 or the HCDS gas which remains after contributing to the formation of the silicon-containing layer from the process chamber 201. The residual gas in the process chamber 201 may not be completely excluded and the interior of the process chamber 201 may not be completely purged. If an amount of the residual gas in the process chamber 201 is very small, this has no adverse effect on the subsequent Step 2. In this case, there is no need to provide a high flow rate of the $N_2$ gas supplied into the process chamber 201. For example, the same volume of the $N_2$ gas as the reaction tube 203 (the process chamber 201) may be supplied into the process chamber 201 to purge the interior of the process chamber 201 to such a degree that this has no adverse effect on Step 2. In this way, when the interior of the process chamber 201 is not completely purged, purge time can be shortened, thereby improving a throughput. This can also limit consumption of the $N_2$ gas to the minimum required for purging.

Examples of the chlorosilane-based raw material gas may include inorganic raw material gases such as a tetrachlorosilane or silicon tetrachloride ($SiCl_4$, STC) gas, a trichlorosilane ($SiHCl_3$, TCS) gas, a dichlorosilane ($SiH_2Cl_2$, DCS) gas, a monochlorosilane ($SiH_3Cl$, MCS) gas and the like, in addition to a hexachlorodisilane ($Si_2Cl_6$) gas. Examples of the inert gas may include rare gases such as an Ar gas, a He gas, a Ne gas, a Xe gas and the like, in addition to the $N_2$ gas.

<Step 2>
<TEA Gas Supply>

After Step 1 is completed to remove the residual gas from the process chamber 201, the valve 243b of the second gas supply pipe 232b is opened to flow a TEA gas into the second gas supply pipe 232b. A flow rate of the TEA gas flowing into the second gas supply pipe 232b is regulated by the mass flow controller 241b. The TEA gas with its flow rate regulated is supplied from the gas supply holes 250b of the second nozzle 249b into the process chamber 201. The TEA gas supplied into the process chamber 201 is activated by heat and is exhausted from the exhaust pipe 231. At this time, the TEA gas activated by heat is supplied to the wafers 200. At the same time, the valve 243f is opened to flow the $N_2$ gas as an inert gas into the second inert gas supply pipe 232f. A flow rate of the $N_2$ gas flowing into the second inert gas supply pipe 232f is regulated by the mass flow controller 241f. The $N_2$ gas with its flow rate regulated is supplied into the process chamber 201, along with the TEA gas, and is exhausted from the exhaust pipe 231. At this time, in order to prevent the TEA gas from being introduced into the first nozzle 249a and the third nozzle 249c, the valves 243e and 243g are opened to flow the $N_2$ gas into the first inert gas supply pipe 232e and the third inert gas supply pipe 232g. The $N_2$ gas is supplied into the process chamber 201 via the first gas supply pipe 232a, the third gas supply pipe 232c, the first nozzle 249a and the third nozzle 249c and is exhausted from the exhaust pipe 231.

At this time, the APC valve 244 is appropriately regulated to set the internal pressure of the process chamber 201 to fall within a range of, for example, 1 to 13300 Pa, preferably 399 to 3990 Pa. When the internal pressure of the process chamber 201 is set to such a relatively high range of pressure, the TEA gas can be thermally activated by non-plasma. Such thermal activation of the TEA gas may cause a soft reaction which may result in soft modification, as will be described later. The flow rate of TEA gas controlled by the mass flow controller 241b is set to fall within a range of, for example, 100 to 2000 sccm. The flow rates of $N_2$ gases controlled by the mass flow controllers 241f, 241e and 241g are set to fall within a range of, for example, 100 to 10000 sccm. A partial pressure of the TEA gas in the process chamber 201 is set to fall within a range of, for example, 0.01 to 12667 Pa. The time period during which the thermally-activated TEA gas is supplied to the wafers 200, that is, gas supply time (irradiation time), is set to fall within a range of, for example, 1 to 120 seconds, preferably 1 to 60 seconds. At this time, the heater 207 is set to a temperature such that the temperature of the wafers 200 is set to fall within a range of, for example, 250 to 700 degrees C., preferably 350 to 650 degrees C., as in Step 1.

The supply of TEA gas results in reaction of the silicon-containing layer formed on the wafers 200 in Step 1 with the TEA gas. This reaction allows the silicon-containing layer to be changed (modified) to a first layer containing silicon (Si), nitrogen (N) and carbon (C). The first layer is a layer which contains Si, N and C and has a thickness ranging from less than one atom layer to several atom layers. The first layer has a relatively high percentage of Si and C ingredients, i.e., Si-rich as well as C-rich. Chlorine (Cl) contained in the silicon-containing layer or hydrogen contained in the TEA gas upon forming the Si, N and C-containing layer as the first layer forms a gaseous material such as, for example, a chlorine ($Cl_2$) gas, a hydrogen ($H_2$) gas, a hydrogen chloride (HCl) gas or the like in the course of modification reaction of the silicon-containing layer by the TEA gas and is discharged out of the process chamber 201 via the exhaust pipe 231.

<Residual Gas Removal>

After the first layer is formed, the valve 243b of the second gas supply pipe 232b is closed to stop the supply of the TEA gas. At this time, with the APC valve 244 of the exhaust pipe 231 opened, the interior of the process chamber 201 is vacuum-exhausted by the vacuum pump 246 and unreacted TEA gas remaining in the process chamber 201 or TEA gas which remains after contributing to the formation of the first layer, and reactive by-products are excluded from the process chamber 201.

As described above, in the film forming sequence of this embodiment, the internal pressure of the process chamber 201 in the process of supplying the TEA gas is set to be relatively high, for example, higher than the internal pressure of the process chamber 201 in the process of supplying the HCDS gas or may be higher than the internal pressure of the process chamber 201 in a process of supplying an $O_2$ gas, which will be described later. In this way, when the residual gas is removed after performing the process of supplying the TEA gas with the internal pressure of the process chamber 201 set to be relatively high, that is, the process of exhausting the TEA gas remaining in the process chamber 201 with the supply of the TEA gas stopped, is performed, a large amount and high concentration of the TEA gas is exhausted into the exhaust line at one time. When HCDS gas remaining in the downstream side of the vacuum pump 246 in the exhaust line, in particular in a portion between the trap device 247 and the harm-removing device 248 reacts with the large amount of the TEA gas exhausted at one time, a large amount of reaction byproducts is produced which is likely to block the exhaust line. That is, exhausting the large amount and high concentration of the TEA gas at one time in an exhaust initial stage of the process of exhausting the TEA gas remaining in the process chamber 201 with the supply of the TEA gas stopped may be one of the causes of producing a large amount of reaction byproducts in the downstream side of the vacuum pump 246 in the exhaust line.

In this embodiment, in order to prevent the large amount and high concentration of the TEA gas from being exhausted at one time in the exhaust initial stage of the process of exhausting the TEA gas remaining in the process chamber 201 with the supply of the TEA gas stopped, exhaust of the interior of the process chamber 201 is performed in multiple stages by performing a first residual TEA gas exhaust process (first residual gas removal process) of exhausting the TEA gas remaining in the process chamber 201 with a degree of valve opening of the APC valve 244 as a first degree of valve opening and a second residual TEA gas exhaust process (second residual gas removal process) of exhausting the TEA gas remaining in the process chamber 201 with a degree of valve opening of the APC valve 244 as a second degree of valve opening which is higher than the first degree of valve opening, in this order.

<First Residual Gas Removal>

First, in the first residual TEA gas exhaust process, exhaust capability of the exhaust line is set to first exhaust capability with the degree of valve opening of the APC valve 244 as the first degree of valve opening. As used herein, the term "first degree of valve opening" refers to a degree of valve opening of the APC valve 244 when the set internal pressure (target pressure) of the process chamber 201 is set to a first set pressure, for example, a pressure in a range of 399 to 2600 Pa. For example, this refers to a degree of valve opening which is narrower (smaller) than a degree of valve opening when the APC valve 244 is full-opened. When the degree of valve opening of the APC valve 244 is adjusted, e.g., to a narrower degree of valve opening, the TEA gas remaining in the process chamber 201 is gradually exhausted such that the actual internal pressure of the process chamber 201 approaches the first set internal pressure. The time period during which the interior of the process chamber 201 is exhausted with the degree of valve opening of the APC valve 244 as the first degree of valve opening, that is, a time period of the first residual TEA gas exhaust process, refers to the time period required for the TEA gas remaining in the process chamber 201 to have a concentration which is low enough to provide no significant reaction with the residual HCDS gas even when the TEA gas is exhausted at one time. For example, this time period is set to fall within a range of 5 to 60 seconds. The heater 207 is set to the same temperature as in Step 1.

<Second Residual Gas Removal>

Next, in the second residual TEA gas exhaust process, exhaust capability of the exhaust line is set to a second exhaust capability, which is higher than the first exhaust capability, with the degree of valve opening of the APC valve 244 as the second degree of valve opening, e.g., one that is higher than the first degree of valve opening. As used herein, the term "second degree of valve opening" refers to a degree of valve opening of the APC valve 244 when the set internal pressure of the process chamber 201 is set to a second set pressure, for example, a pressure in a range of 2 to 1330 Pa. For example, this refers to a degree of valve opening when the APC valve 244 is fully-opened. When the degree of valve opening of the APC valve 244 is adjusted to such a wide (large) degree of valve opening, the low concentration TEA gas remaining in the process chamber 201 is exhausted at one time such that the actual internal pressure of the process chamber 201 approaches the second set internal pressure. The time period during which the interior of the process chamber 201 is exhausted with the degree of valve opening of the APC valve 244 as the second degree of valve opening, that is, a time period of the second residual TEA gas exhaust process, refers to the time period required for unreacted TEA gas remaining in the process chamber 201 or TEA gas which remains after contributing to the formation of the first layer, and reactive by-products to be excluded from the process chamber 201. For example, this time period is set to fall within a range of 5 to 60 seconds. The heater 207 is set to the same temperature as in Step 1.

In this way, in the exhaust initial stage of exhausting the TEA gas remaining in the process chamber 201 with the supply of the TEA gas stopped (the first residual TEA gas exhaust process), the high concentration TEA gas is gradually exhausted to reduce a probability of reaction of the HCDS and TEA gases remaining in the downstream side of the vacuum pump 246 in the exhaust line. Then, at the point of time when the concentration of the TEA gas in the process chamber 201 is lowered enough to provide no significant reaction with the residual HCDS gas even when the TEA gas is exhausted at one time, the remaining TEA gas is exhausted at one time (second residual TEA gas exhaust process). This makes it possible to reduce a probability of reaction of the HCDS and TEA gases remaining in the downstream side of the vacuum pump 246 in the exhaust line in either the first residual TEA gas exhaust process or the second residual TEA gas exhaust process, thereby preventing a large amount of reaction byproducts from being produced in the downstream side of the vacuum pump 246 in the exhaust line.

In addition, in both of the first residual TEA gas exhaust process and the second residual TEA gas exhaust process, the supply of the $N_2$ gas as the inert gas remains with the valves 243f, 243e and 243g opened. In this way, when the $N_2$ gas as the inert gas is supplied into the process chamber 201 in the first residual TEA gas exhaust process and the second residual TEA gas exhaust process, a partial pressure of the TEA gas in the exhausted gas can be lowered. In addition, when the $N_2$ gas as the inert gas is continuously supplied into the process chamber 201 in the first residual TEA gas exhaust process and the second residual TEA gas exhaust process, the partial pressure of the TEA gas in the exhausted gas can remain lowered. This makes it possible to further reduce a probability of reaction of the HCDS and TEA gases remaining in the downstream side of the vacuum pump 246 in the exhaust line in either the first residual TEA gas exhaust process or the second residual TEA gas exhaust process, thereby further preventing a large amount of reaction byproducts from being produced in the downstream side of the vacuum pump 246 in the exhaust line. Flow rates of the $N_2$ gases controlled by the mass flow controllers 241f, 241e and 241g are set to fall within a range of, for example, 100 to 5000 sccm.

The $N_2$ gases supplied in the first residual TEA gas exhaust process and the second residual TEA gas exhaust process act as purge gases by which unreacted TEA gas remaining in the process chamber 201 or TEA gas which remains after contributing to the formation of the first layer, and reactive by-products can be excluded from the process chamber 201 more effectively. However, in the first residual TEA gas exhaust process and the second residual TEA gas exhaust process, the residual gas in the process chamber 201 may not be completely excluded and the interior of the process chamber 201 may not be completely purged. If an amount of the residual gas in the process chamber 201 is very small, this has no adverse effect on the subsequent Step 3. In this case, there is no need to provide a high flow rate of the $N_2$ gas supplied into the process chamber 201. For example, the same volume of the $N_2$ gas as the reaction tube 203 (the process chamber 201) may be supplied into the process chamber 201 to purge the interior of the process chamber 201 to such a degree that this has no adverse effect on Step 3. In this way, when the interior of the process chamber 201 is not completely purged, purge time can be shortened, thereby improving a throughput. This can also limit consumption of the $N_2$ gas to the minimum required for purging.

Examples of the amine-based gas may preferably include, in addition to a triethylamine ($(C_2H_5)_3N$, TEA) gas, an ethylamine-based gas such as a diethylamine ($(C_2H_5)_2NH$, DEA) gas, a monoethylamine ($C_2H_5NH_2$, MEA) gas or the like, a methylamine-based gas such as trimethylamine ($(CH_3)_3N$, TMA) gas, a dimethylamine ($(CH_3)_2NH$, DMA) gas, a monomethylamine ($CH_3NH_2$, MMA) gas or the like, a propylamine-based gas such as a tripropylamine ($(C_3H_7)_3N$, TPA) gas, a dipropylamine ($(C_3H_7)_2NH$, DPA) gas, a monopropylamine ($C_3H_7NH_2$, MPA) gas or the like, an isopropylamine-based gas such as a triisopropylamine ($[(CH_3)_2CH]_3N$, TIPA) gas, a diisopropylamine ($[(CH_3)_2CH]_2NH$, DIPA) gas, a monoisopropylamine ($(CH_3)_2CHNH_2$, MIPA) gas or the like, a butylamine-based gas such as a tributylamine ($(C_4H_9)_3N$, TBA) gas, a dibutylamine ($(C_4H_9)_2NH$, DBA) gas, a monobutylamine ($C_4H_9NH_2$, MBA) gas or the like, or an isobutylamine-based gas such as a triisobutylamine ($[(CH_3)_2CHCH_2]_3N$, TIBA) gas, a diisobutylamine ($[(CH_3)_2CHCH_2]_2NH$, DIBA) gas, a monoisobutylamine ($(CH_3)_2CHCH_2NH_2$, MIBA) gas or the like. That is, examples of the amine-based gas may preferably include at least one gas of $(C_2H_5)_xNH_{3-x}$, $(CH_3)_xNH_{3-x}$, $(C_3H_7)_xNH_{3-x}$, $[(CH_3)_2CH]_xNH_{3-x}$ and $(C_4H_9)_xNH_{3-x}$, $[(CH_3)_2CHCH_2]_xNH_{3-x}$ (where, x is an integer from 1 to 3). Examples of the inert gas may include rare gases such as an Ar gas, a He gas, a Ne gas, a Xe gas and the like, in addition to the $N_2$ gas.

<Step 3>

After Step 2 is completed to remove the residual gas from the process chamber 201, the valve 243c of the third gas supply pipe 232c is opened to flow an $O_2$ gas into the third gas supply pipe 232c. A flow rate of the $O_2$ gas flowing into the third gas supply pipe 232c is regulated by the mass flow controller 241c. The $O_2$ gas with its flow rate regulated is supplied from the gas supply holes 250c of the third nozzle 249c into the process chamber 201. The $O_2$ gas supplied into the process chamber 201 is activated by heat and is exhausted from the exhaust pipe 231. At this time, the $O_2$ gas activated by heat is supplied to the wafers 200. At the same time, the valve 243g is opened to flow $N_2$ gas into the third inert gas supply pipe 232g. The $N_2$ gas is supplied into the process chamber 201, along with the $O_2$ gas, and is exhausted from the exhaust pipe 231. At this time, in order to prevent the $O_2$ gas from being introduced into the first nozzle 249a and the second nozzle 249b, the valves 243e and 243f are opened to flow the $N_2$ gas into the first inert gas supply pipe 232e and the second inert gas supply pipe 232f. The $N_2$ gas is supplied into the process chamber 201 via the first gas supply pipe 232a, the second gas supply pipe 232b, the first nozzle 249a and the second nozzle 249b and is exhausted from the exhaust pipe 231.

At this time, the APC valve 244 is appropriately regulated to set the internal pressure of the process chamber 201 to fall within a range of, for example, 1 to 3000 Pa. When the internal pressure of the process chamber 201 is set to such a relatively high range of pressure, the $O_2$ gas can be thermally activated by non-plasma. Such thermal activation of the $O_2$ gas may cause a soft reaction which may result in soft modification. The flow rate of $O_2$ gas controlled by the mass flow controller 241c is set to fall within a range of, for example, 100 to 10000 sccm. The flow rates of $N_2$ gases controlled by the mass flow controllers 241g, 241e and 241f are set to fall within a range of, for example, 100 to 10000 sccm. A partial pressure of the $O_2$ gas in the process chamber 201 is set to fall within a range of, for example, 0.01 to 2970 Pa. The time period during which the thermally-activated $O_2$ gas is supplied to the wafers 200, that is, gas supply time (irradiation time), is set to fall within a range of, for example, 1 to 120 seconds, preferably 1 to 60 seconds. At this time, the heater 207 is set to a temperature such that the temperature of the wafers 200 is set to fall within a range of, for example, 250 to 700 degrees C., preferably 350 to 650 degrees C., as in Steps 1 and 2.

At this time, a gas flown into the process chamber 201 is only the $O_2$ gas thermally activated by the high internal pressure of the process chamber 201 rather than the HCDS gas and the TEA gas. Therefore, the activated $O_2$ gas reacts with at least a portion of the Si, N and C-containing first layer formed on the wafers 200 in Step 2, without causing any gaseous reaction. This allows the first layer to be oxidized to be modified into a silicon oxycarbonitride layer (SiOCN layer) or a silicon oxycarbide layer (SiOC layer) as the second layer.

In addition, when the thermally-activated $O_2$ gas is flown into the process chamber 201, the first layer can be thermally oxidized to be modified (changed) into the SiOCN layer or the SiOC layer. At this time, the first layer is modified into the SiOCN layer or the SiOC layer while oxygen (O) ingredients are being added to the first layer. In addition, thermal oxidation by the $O_2$ gas increases a Si—O bond in the first layer, while decreasing a Si—N bond, a Si—C bond and a Si—Si bond, thereby providing a reduced percentage of N, C and Si ingredients in the first layer. In this case, when thermal oxidation time is extended or an oxidizing power in the thermal oxidation is increased, most of the N ingredients can be separated to reduce the N ingredients up to a level of impurity or substantially remove the N ingredients. That is, the first layer can be modified into the SiOCN layer or the SiOC layer while changing a composition ratio in such a manner that the oxygen concentration is increased whereas the nitrogen, carbon and silicon concentrations are decreased. In addition, when process conditions such as the internal pressure of the process chamber 201, gas supply time and so on are controlled, a percentage of oxygen (O) ingredients in the SiOCN layer or the SiOC layer, that is, the oxygen concentration, can be minutely adjusted and a composition ratio of the SiOCN layer or the SiOC layer can be more precisely controlled.

In addition, it is clear that the C ingredients in the first layer formed in Steps 1 and 2 are rich compared to the N ingredients. For example, some experiments showed that the carbon concentration is two times or more as high as the nitrogen concentration. That is, by stopping the oxidation before completely separating the N ingredients from the first layer by virtue of the thermal oxidation by the $O_2$ gas, i.e., under a state where the N ingredients remain, the C and N ingredients are left in the first layer, which leads to modification of the first layer into the SiOCN layer. In addition, even in the phase where most of the N ingredients in the first layer are completely separated by virtue of the thermal oxidation by the $O_2$ gas, the C ingredients are left in the first layer and the first layer is modified into the SiOC layer by stopping the oxidation under this state. That is, when gas supply time (oxidation time) or an oxidizing power is controlled, a percentage of C ingredients, i.e., the carbon concentration, can be controlled and one of the SiOCN layer and the SiOC layer can be formed while controlling its composition ratio. In addition, when process conditions such as the internal pressure of the process chamber 201, gas supply time and so on are controlled, a percentage of oxygen (O) ingredients in the SiOCN layer or the SiOC layer, that is, the oxygen concentration, can be minutely adjusted and a composition ratio of the SiOCN layer or the SiOC layer can be more precisely controlled.

At this time, it is preferable that the oxidation reaction of the first layer is not saturated. For example, when the first layer having a thickness of one atom layer or less is formed in Steps 1 and 2, it is preferable to oxidize a portion of the first layer. In this case, the oxidation is performed in such a manner that the oxidation reaction of the first layer is unsaturated in order to prevent the entire first layer having the thickness of one atom layer or less from being oxidized.

Although the unsaturation of the oxidation reaction of the first layer may be achieved under the above-mentioned process conditions employed in Step 3, it can be more easily achieved by changing the above-mentioned process conditions of Step 3 to the following process conditions.

Wafer temperature: 500 to 650 degrees C.
Internal pressure of process chamber: 133 to 2666 Pa
$O_2$ gas partial pressure: 33 to 2515 Pa
Flow rate of supplied $O_2$ gas: 1000 to 5000 sccm
Flow rate of supplied $N_2$ gas: 300 to 3000 sccm
$O_2$ gas supply time: 6 to 60 seconds Thereafter, the valve 243c of the third gas supply pipe 232c is closed to stop the supply of the $O_2$ gas. At this time, with the APC valve 244 of the exhaust pipe 231 opened, the interior of the process chamber 201 is vacuum-exhausted by the vacuum pump 246 and unreacted $O_2$ gas remaining in the process chamber 201 or $O_2$ gas which remains after contributing to the formation of the second layer and reaction byproducts are excluded from the process chamber 201. At this time, with the valves 243g, 243e and 243f opened, the supply of the $N_2$ gas into the process chamber 201 is maintained. The $N_2$ gas acts as purge gas which is capable of improving the effect of excluding the unreacted $O_2$ gas remaining in the process chamber 201 or the $O_2$ gas which remains after contributing to the formation of the second layer and the reaction byproducts from the process chamber 201. The residual gas in the process chamber 201 may not be completely excluded and the interior of the process chamber 201 may not be completely purged. If an amount of the residual gas in the process chamber 201 is very small, this has no adverse effect on the subsequent Step 1. In this case, there is no need to provide a high flow rate of the $N_2$ gas supplied into the process chamber 201. For example, the same volume of the $N_2$ gas as the reaction tube 203 (the process chamber 201) may be supplied into the process chamber 201 to purge the interior of the process chamber 201 to such a degree that this has no adverse effect on Step 1. In this way, when the interior of the process chamber 201 is not completely purged, purge time can be shortened, thereby improving a throughput. This can also limit consumption of the $N_2$ gas to the minimum required for purging.

Examples of the oxygen-containing gas may include nitrous oxide ($N_2O$) gas, nitrogen monoxide (NO) gas, nitrogen dioxide ($NO_2$) gas, ozone ($O_3$) gas, hydrogen ($H_2$) gas+oxygen ($O_2$) gas, $H_2$ gas+$O_3$ gas, vapour ($H_2O$) gas, carbon monoxide (CO) gas, carbon dioxide ($CO_2$) gas and the like, in addition to $O_2$ gas. Examples of the inert gas may include rare gases such as Ar gas, He gas, Ne gas, Xe gas and the like, in addition to $N_2$ gas.

When one cycle including the above-described Steps 1 to 3 is performed once or more (predetermined number of times), a silicon oxycarbonitride film (SiOCN film) or a silicon oxycarbide film (SiOC film) having a predetermined composition and thickness can be formed on the wafers 200. This cycle may be preferably performed several times rather than once. That is, a thickness of the SiOCN layer or SiOC layer formed per cycle may be set to be smaller than a desired thickness and the cycle may be repeated several times until the SiOCN layer or SiOC layer reaches the desired thickness.

<Purge and Return to Atmospheric Pressure>

Once the film formation process of forming the silicon oxycarbonitride film or silicon oxycarbide film having the predetermined composition and thickness is completed, the valves 243e, 243f and 243g are opened and $N_2$ gases as inert gases are supplied from the respective first inert gas supply pipe 232e, second inert gas supply pipe 232f, and third inert gas supply pipe 232g into the process chamber 201 and are exhausted from the exhaust pipe 231 such that the interior of the process chamber 201 is purged by the inert gases (gas purge), thereby removing gas remaining in the process chamber 201 and reaction byproducts from the process chamber 201. Thereafter, the internal atmosphere of the process chamber 201 is substituted with the inert gas (inert gas substitution) and the internal pressure of the process chamber 201 returns to the atmospheric pressure (return to atmospheric pressure).

<Boat Unload and Wafer Discharge>

Thereafter, the seal cap 219 is descended by the boat elevator 115 to open the bottom of the reaction tube 203 while carrying the processed wafers 200 from the bottom of the reaction tube 203 out of the reaction tube 203 with them supported by the boat 217 (boat unload). Thereafter, the processed wafers 200 are discharged out of the boat 217 (wafer discharge).

(3) Certain Advantages

According to this embodiment, in the exhaust initial stage of the process of exhausting the TEA gas remaining in the process chamber 201 with the supply of the TEA gas stopped (the first residual TEA gas exhaust process), the high concentration TEA gas is gradually exhausted to reduce a probability of reaction of the HCDS and TEA gases remaining in the downstream side of the vacuum pump 246 in the exhaust line. Then, at the point of time when the concentration of the TEA gas in the process chamber 201 is lowered enough to provide no significant reaction with the residual HCDS gas even when the TEA gas is exhausted at one time, the remaining TEA gas is exhausted at one time (second residual TEA gas exhaust process). This makes it possible to reduce a probability of reaction of the HCDS and TEA gases remaining in the downstream side of the vacuum pump 246 in the exhaust line in either the first residual TEA gas exhaust process or the second residual TEA gas exhaust process, thereby preventing a large amount of reaction byproducts from being produced in the downstream side of the vacuum pump 246 in the exhaust line.

In addition, according to this embodiment, when the $N_2$ gas as the inert gas is supplied into the process chamber 201 in the first residual TEA gas exhaust process and the second residual TEA gas exhaust process, a partial pressure of the TEA gas in the exhausted gas can be lowered. In addition, when the $N_2$ gas as the inert gas is continuously supplied into the process chamber 201 in the first residual TEA gas exhaust process and the second residual TEA gas exhaust process, the partial pressure of the TEA gas in the exhausted gas can remain lowered. This makes it possible to further reduce a probability of reaction of the HCDS and TEA gases remaining in the downstream side of the vacuum pump 246 in the exhaust line in either the first residual TEA gas exhaust process or the second residual TEA gas exhaust process, thereby further preventing a large amount of reaction byproducts from being produced in the downstream side of the vacuum pump 246 in the exhaust line.

As a result, according to this embodiment, it is possible to prevent a back pressure of the vacuum pump 246, that is, an internal pressure of the exhaust pipe 231 in the downstream side of the vacuum pump 246, from increasing when the SiOCN film or SiOC film is formed on the wafers 200. This may lead to precise and quick control of the internal pressure of the process chamber 201 and hence improvement of quality and productivity of substrate processing. In addition, since reaction byproducts are prevented from being deposited onto the exhaust pipe 231, the frequency of maintenance of the exhaust line can be reduced and the productivity of substrate processing apparatuses can be improved.

In addition, according to this embodiment, the above-described advantages can be achieved without having to increase the exhaust capability of the vacuum pump 246 or heat the exhaust pipe 231. That is, the above-described advantages can be achieved only by changing an exhaust sequence when the residual TEA gas in the process chamber is exhausted, without having to make a significant change in the physical configuration of the substrate processing apparatus 100. This may result in effective reduction of costs for substrate processing.

<Second Embodiment>

Next, a second embodiment of the present disclosure will be described.

While an example of using the oxygen-containing gas ($O_2$ gas) as a reaction gas to form a silicon oxycarbonitride film or a silicon oxycarbide film having a predetermined composition and thickness on the wafers 200 has been illustrated in the first embodiment, an example of using a nitrogen-containing gas ($NH_3$ gas) as a reaction gas to form a silicon carbonitride film having a predetermined composition and thickness on the wafers 200 will be now illustrated in a second embodiment.

Specifically, the second embodiment provides an example of forming a silicon carbonitride film (SiCN film) having a predetermined composition and thickness on the wafers 200 by performing a cycle including a process of forming a silicon-containing layer on the wafer 200 by supplying a raw material gas (HCDS gas) to the heated wafer 200 in the process chamber 201, exhausting the HCDS gas remaining in the process chamber 201 by means of the exhaust line under a state where the supply of the HCDS gas is stopped, modifying the silicon-containing layer to form a first layer containing silicon, nitrogen and carbon by supplying an amine-based gas (TEA gas) to the heated wafer 200 in the process chamber 201, exhausting the TEA gas remaining in the process chamber 201 by means of the exhaust line under a state where the supply of the TEA gas is stopped, modifying the first layer to form a silicon oxycarbonitride layer as a second layer by supplying a nitrogen-containing gas ($NH_3$ gas) as a reaction gas different from the HCDS gas and TEA gas to the heated wafer 200 in the process chamber 201, and exhausting the $NH_3$ gas remaining in the process chamber 201 by means of the exhaust line under a state where the supply of the $NH_3$ gas is stopped, by a predetermined number of times (n times).

Figure 6:
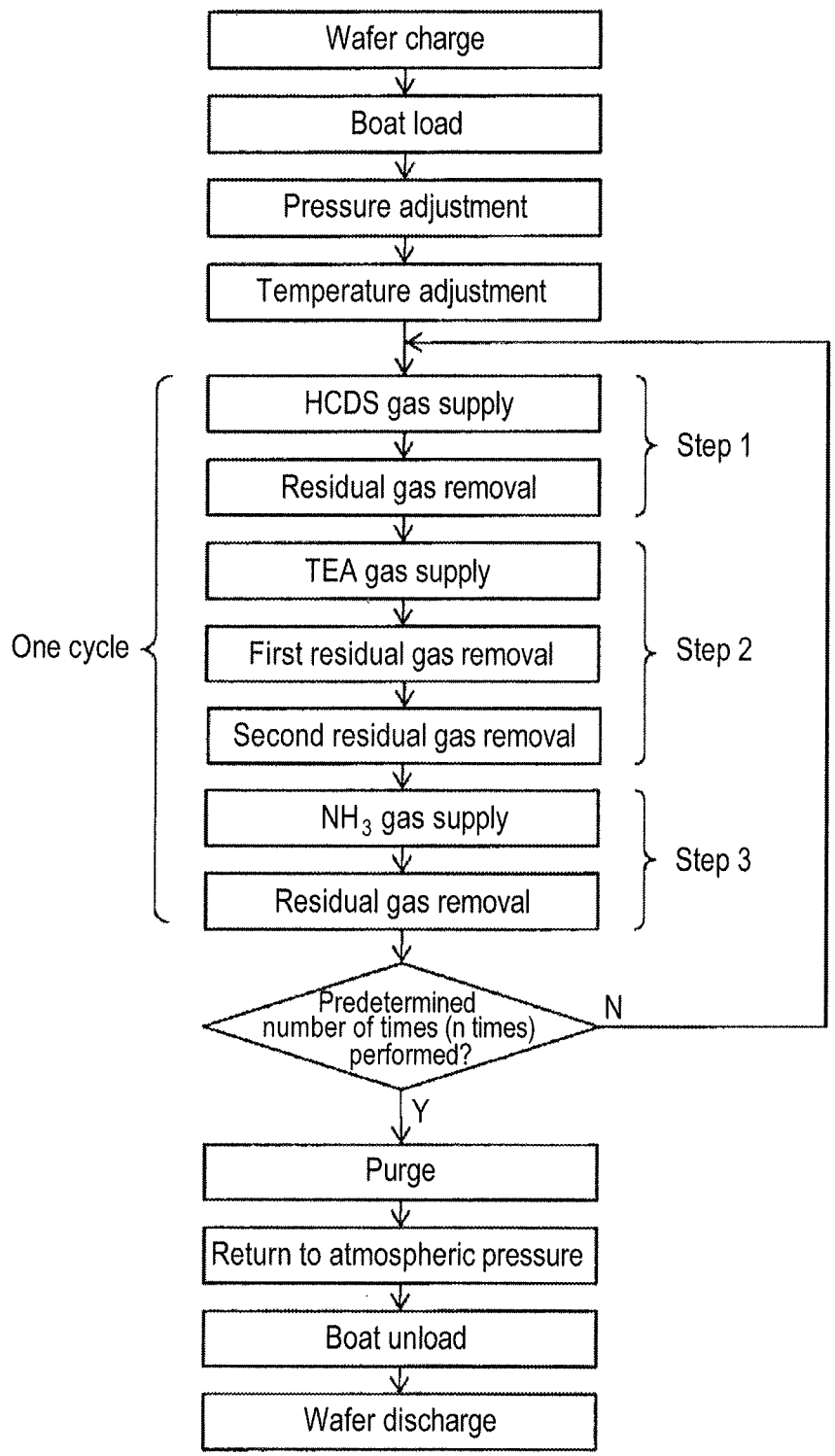
FIG. 6 is a flow chart illustrating a flow of film formation according to a second embodiment.
Figure 7:
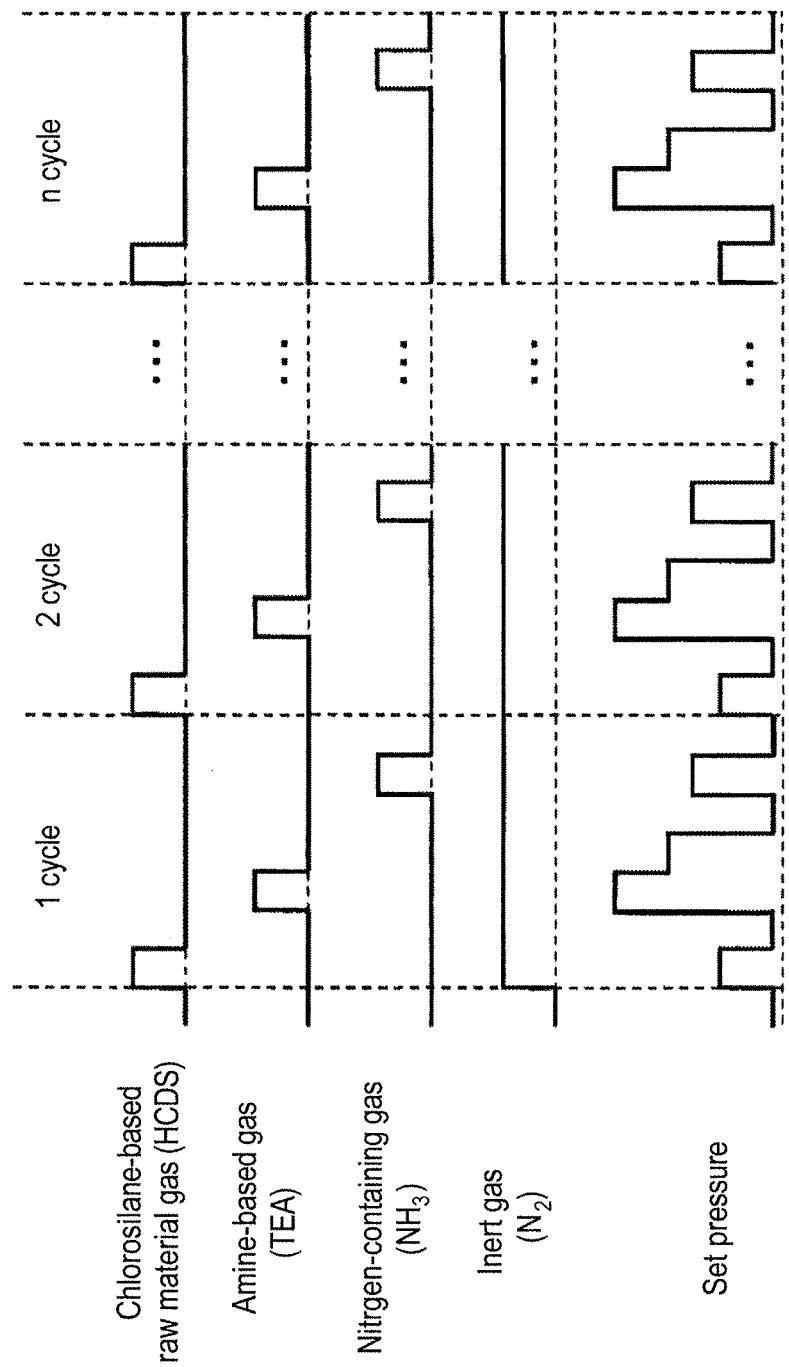
FIG. 7 is a timing diagram of gas being supplied in a film forming sequence of the second embodiment.

FIG. 6 is a flow chart illustrating a film forming flow according to this second embodiment. FIG. 7 is a timing diagram illustrating a timing of gas being supplied in a film forming sequence according to this second embodiment. This second embodiment has the same configuration as the first embodiment except that the former uses thermally-activated $NH_3$ gas as a reaction gas in Step 3. That is, the second embodiment has the same configuration as the first embodiment in that, when the TEA gas remaining in the process chamber 201 is exhausted with the supply of the TEA gas stopped in Step 2, the first residual TEA gas exhaust process of exhausting the TEA gas remaining in the process chamber 201 with the degree of valve opening of the APC valve 244 as the first degree of valve opening and the second residual TEA gas exhaust process of exhausting the TEA gas remaining in the process chamber 201 with the degree of valve opening of the APC valve 244 as the second degree of valve opening which is higher than the first degree of valve opening are performed in this order. Step 3 of this embodiment will be described below.

<Step 3>

After Step 2 is completed to remove the residual gas from the process chamber 201, the valve 243d of the fourth gas supply pipe 23d is opened to flow the $NH_3$ gas into the fourth gas supply pipe 232d. A flow rate of the $NH_3$ gas flowing into the fourth gas supply pipe 232d is regulated by the mass flow controller 241d. The $NH_3$ gas with its flow rate regulated is supplied from the gas supply holes 250c of the third nozzle 249c into the process chamber 201. The $NH_3$ gas supplied into the process chamber 201 is activated by heat and is exhausted from the exhaust pipe 231. At this time, the $NH_3$ gas activated by heat is supplied to the wafers 200. At the same time, the valve 243g is opened to flow $N_2$ gas into the third inert gas supply pipe 232g. The $N_2$ gas is supplied into the process chamber 201, along with the $NH_3$ gas, and is exhausted from the exhaust pipe 231. At this time, in order to prevent the $NH_3$ gas from being introduced into the first nozzle 249a and the second nozzle 249b, the valves 243e and 243f are opened to flow the $N_2$ gas into the first inert gas supply pipe 232e and the second inert gas supply pipe 232f. The $N_2$ gas is supplied into the process chamber 201 via the first gas supply pipe 232a, the second gas supply pipe 232b, the first nozzle 249a and the second nozzle 249b and is exhausted from the exhaust pipe 231.

At this time, the APC valve 244 is appropriately regulated to set the internal pressure of the process chamber 201 to fall within a range of, for example, 1 to 3000 Pa. When the internal pressure of the process chamber 201 is set to such a relatively high range of pressure, the $NH_3$ gas can be thermally activated by non-plasma. Such thermal activation of the $NH_3$ gas may cause a soft reaction which may result in soft modification which will be described later. The flow rate of $NH_3$ gas controlled by the mass flow controller 241c is set to fall within a range of, for example, 100 to 10000 sccm. The flow rates of $N_2$ gases controlled by the mass flow controllers 241g, 241e and 241f are set to fall within a range of, for example, 100 to 10000 sccm. A partial pressure of the $NH_3$ gas in the process chamber 201 is set to fall within a range of, for example, 0.01 to 2970 Pa. The time period during which the thermally-activated $NH_3$ gas is supplied to the wafers 200, that is, gas supply time (irradiation time), is set to fall within a range of, for example, 1 to 120 seconds, preferably 1 to 60 seconds. At this time, the heater 207 is set to a temperature such that the temperature of the wafers 200 is set to fall within a range of, for example, 250 to 700 degrees C., preferably 350 to 650 degrees C., as in Steps 1 and 2.

At this time, a gas flown into the process chamber 201 is only the $NH_3$ gas thermally activated by the high internal pressure of the process chamber 201 rather than the HCDS gas and the TEA gas. Therefore, the activated $NH_3$ gas reacts with at least a portion of the Si, N and C-containing first layer formed on the wafers 200 in Step 2, without causing any gaseous reaction. This allows the first layer to be nitrified to be modified into a silicon oxycarbonitride layer (SiCN layer) as the second layer.

In addition, when the thermally-activated $NH_3$ gas is flown into the process chamber 201, the first layer can be thermally nitrified to be modified (changed) into the SiCN layer. At this time, the first layer is modified into the SiCN layer while a percentage of nitrogen (N) ingredients in the first layer is being increased. In addition, thermal nitrification by the $NH_3$ gas increases a Si—N bond in the first layer, while decreasing a Si—C bond and a Si—Si bond, thereby providing a reduced percentage of C and Si ingredients in the first layer. That is, the first layer can be modified into the SiCN layer while changing a composition ratio in such a manner that the nitrogen concentration is increased whereas the carbon and silicon concentrations are decreased. In addition, when process conditions such as the internal pressure of the process chamber 201, gas supply time and so on are controlled, a percentage of nitrogen (N) ingredients in the SiCN layer, that is, the nitrogen concentration, can be minutely adjusted and a composition ratio of the SiCN layer can be more precisely controlled.

At this time, it is preferable that the nitrification reaction of the first layer is not saturated. For example, when the first layer having a thickness of one atom layer or less is formed in Steps 1 and 2, it is preferable to oxidize a portion of the first layer. In this case, the nitrification is performed in such a manner that the nitrification reaction of the first layer is unsaturated in order to prevent the entire first layer having the thickness of one atom layer or less from being oxidized.

Although the unsaturation of the nitrification reaction of the first layer may be achieved under the above-mentioned process conditions employed in Step 3, it can be more easily achieved by changing the above-mentioned process conditions of Step 3 to the following process conditions.

Wafer temperature: 500 to 650 degrees C.
Internal pressure of process chamber: 133 to 2666 Pa
$NH_3$ gas partial pressure: 33 to 2515 Pa
Flow rate of supplied $NH_3$ gas: 1000 to 5000 sccm
Flow rate of supplied $N_2$ gas: 300 to 3000 sccm
$NH_3$ gas supply time: 6 to 60 seconds Thereafter, the valve 243d of the fourth gas supply pipe 232d is closed to stop the supply of the $NH_3$ gas. At this time, with the APC valve 244 of the exhaust pipe 231 opened, the interior of the process chamber 201 is vacuum-exhausted by the vacuum pump 246 and unreacted $NH_3$ gas remaining in the process chamber 201 or $NH_3$ gas which remains after contributing to the formation of the second layer and reaction byproducts are excluded from the process chamber 201. At this time, with the valves 243g, 243e and 243f opened, the supply of the $N_2$ gas into the process chamber 201 is maintained. The $N_2$ gas acts as purge gas which is capable of improving the effect of excluding the unreacted $NH_3$ gas remaining in the process chamber 201 or the $NH_3$ gas which remains after contributing to the formation of the second layer and the reaction byproducts from the process chamber 201. The residual gas in the process chamber 201 may not be completely excluded and the interior of the process chamber 201 may not be completely purged. If an amount of the residual gas in the process chamber 201 is very small, this has no adverse effect on the subsequent Step 1. In this case, there is no need to provide a high flow rate of the $N_2$ gas supplied into the process chamber 201. For example, the same volume of the $N_2$ gas as the reaction tube 203 (the process chamber 201) may be supplied into the process chamber 201 to purge the interior of the process chamber 201 to such a degree that this has no adverse effect on Step 1. In this way, when the interior of the process chamber 201 is not completely purged, purge time can be shortened, thereby improving a throughput. This can also limit consumption of the $N_2$ gas to the minimum required for purging.

Examples of the nitrogen-containing gas may include diazine ($N_2H_2$) gas, hydrazine ($N_2H_4$) gas, $N_3H_8$ gas, gas containing compounds thereof and the like, in addition to the $NH_3$ gas. Examples of the inert gas may include rare gases such as an Ar gas, a He gas, a Ne gas, a Xe gas and the like, in addition to the $N_2$ gas.

When one cycle including the above-described Steps 1 to 3 is performed once or more (e.g., a predetermined number of times), a silicon oxycarbonitride film (SiCN film) having a predetermined composition and thickness can be formed on the wafers 200. This cycle may be preferably performed several times rather than once. That is, a thickness of the SiCN layer formed per cycle may be set to be smaller than a desired thickness and the cycle may be repeated several times until the SiCN layer reaches the desired thickness.

The second embodiment, as described, has the same effects as the first embodiment. That is, when the TEA gas remaining in the process chamber 201 is exhausted with the supply of the TEA gas stopped in Step 2, by performing the first residual TEA gas exhaust process of exhausting the TEA gas remaining in the process chamber 201 with the degree of valve opening of the APC valve 244 as the first degree of valve opening and the second residual TEA gas exhaust process of exhausting the TEA gas remaining in the process chamber 201 with the degree of valve opening of the APC valve 244 as the second degree of valve opening, which is higher than the first degree of valve opening, in this order, it is possible to prevent a large amount of reaction byproducts from being produced in the downstream side of the vacuum pump 246 in the exhaust line. In addition, when the $N_2$ gas is supplied into the process chamber 201 in the first residual TEA gas exhaust process and the second residual TEA gas exhaust process, it is possible to further prevent a large amount of reaction byproducts from being produced in the downstream side of the vacuum pump 246 in the exhaust line. As a result, it is possible to prevent a back pressure of the vacuum pump 246 from increasing when the SiCN film is formed on the wafers 200. This may lead to precise and quick control of the internal pressure of the process chamber 201 and hence improvement of quality and productivity of substrate processing. In addition, the frequency of maintenance of the exhaust line can be reduced and the productivity of substrate processing apparatuses can be improved. In addition, the above-described advantages can be achieved only by changing an exhaust sequence when the residual TEA gas in the process chamber is exhausted. This may result in effective reduction of costs for substrate processing.

<Other Embodiments>

Although various embodiments have been described in the above, the present disclosure is not limited to these disclosed embodiments and various modifications and changes may be made without departing from the spirit and scope of the present disclosure.

For example, although an example of changing the degree of valve opening of the APC valve 244 in two steps in the process of exhausting the amine-based gas remaining in the process chamber 201 has been illustrated in the above embodiments, the present disclosure is not limited thereto. For example, when exhausting the amine-based gas remaining in the process chamber 201, the degree of valve opening of the APC valve 244 may be changed in 3, 4, 5 or more steps. That is, the degree of valve opening of the APC valve 244 may be changed in multiple steps.

In addition, for example, although an example of supplying the chlorosilane-based raw material gas and the amine-based gas to the wafers 200 in the process chamber 201 in this order when the Si, N and C-containing first layer is formed has been illustrated in the above embodiments, a sequence of supply of these gases may be reversed. That is, the amine-based gas may be first supplied and the chlorosilane-based raw material gas may be then supplied. In other words, one of the chlorosilane-based raw material gas and the amine-based gas is first supplied and the other may be then supplied. Changing the sequence of gas supply in this way allows change in film quality and composition ratio of a film to be formed.

In addition, although an example of using the chlorosilane-based raw material gas as raw material gas to form the silicon-containing layer in Step 1 has been illustrated in the above embodiments, the chlorosilane-based raw material gas may be replaced with other silane-based raw material gas having halogen-based ligands. For example, the chlorosilane-based raw material gas may be replaced with fluorosilane-based raw material gas. Here, the fluorosilane-based raw material gas refers to silane-based raw material gas which has fluoro groups as halogen groups and contains at least a silicon (Si) element and a fluorine (F) element. Examples of the fluorosilane-based raw material gas may include silicon fluoride gas such as tetrafluorosilane (or silicon tetrafluoride ($SiF_4$)) gas, hexafluorodisilane ($Si_2F_6$) gas or the like. In this case, the fluorosilane-based raw material gas is supplied to the wafers 200 in the process chamber 201 to form the silicon-containing layer.

When a silicon insulating film formed according to the above-described embodiments and their modifications is used as a sidewall spacer, it is possible to provide device forming techniques with small leak current and excellent workability.

In addition, when a silicon insulating film formed according to the above-described embodiments and their modifications is used as an etch stopper, it is possible to provide device forming techniques with small leak current and excellent workability.

According to the above-described embodiments and their modifications, it is possible to form a silicon insulating film having an ideal stoichiometry without using plasma even in a low temperature region. In addition, since the silicon insulating film can be formed without using plasma, the above-described embodiments and their modifications may be applied to processes which are concerned about plasma damage, such as, for example, forming a SADP film of DPT.

In addition, although an example of using a raw material gas, an amine-based gas and an oxygen-containing gas to form a SiOCN film or a SiOC film and an example of using a raw material gas, an amine-based gas and a nitrogen-containing gas to form a SiCN film have been illustrated in the above embodiments, the present disclosure is not limited thereto. For example, the present disclosure may be suitably applied to a case where only a raw material gas and an amine-based gas are used to form a SiCN film. In addition, the present disclosure may be suitably applied to a case where a raw material gas, an amine-based gas and a boron-containing gas are used to form a silicoboron carbonitride film (SiBCN film) or a silicoboron nitride film (SiBN film). Examples of the boron-containing gas may include a boron trichloride ($BCl_3$) gas, to diborane ($B_2H_6$) as or a borazine-based gas in this way, the present disclosure may be suitably applied to various substrate processing using a raw material and an amine-based gas.

In addition, although an example of forming a silicon-containing insulating film such as a silicon oxycarbonitride film (SiOCN film), a silicon oxycarbide film (SiOC), a silicon carbonitride film (SiCN film) has been illustrated in the above embodiments, the present disclosure may be applied to a case where a metal-based film containing metal elements such as, for example, titanium (Ti), zirconium (Zr), hafnium (Hf), tantalum (Ta), aluminum (Al), molybdenum (Mo) and the like is formed.

That is, the present disclosure may be suitably applied to a case where a metal oxycarbonitride film such as a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film), a molybdenum oxycarbonitride film (MoOCN film) and the like is formed.

In addition, the present disclosure may be suitably applied to a case where a metal oxycarbide film such as a titanium oxycarbide film (TiOC film), a zirconium oxycarbide film (ZrOC film), a hafnium oxycarbide film (HfOC film), a tantalum oxycarbide film (TaOC film), an aluminum oxycarbide film (AlOC film), a molybdenum oxycarbide film (MoOC film) and the like is formed.

In addition, the present disclosure may be suitably applied to a case where a metal carbonitride film such as a titanium carbonitride film (TiCN film), a zirconium carbonitride film (ZrCN film), a hafnium carbonitride film (HfCN film), a tantalum carbonitride film (TaCN film), an aluminum carbonitride film (AlCN film), a molybdenum carbonitride film (MoCN film) and the like is formed.

In this case, instead of the chlorosilane-based raw material gas used in the above embodiments, raw material gas containing a metal element and a halogen element may be used to form a film using the same sequence as the above embodiments. That is, metal-based films (metal oxycarbonitride film, metal oxycarbide film and metal carbonitride film) having a predetermined composition and thickness can be formed on the wafers 200 by performing a cycle including a process of forming a metal-containing layer on the wafer 200 by supplying a raw material gas containing a metal element and a halogen element to the heated wafer 200 in the process chamber 201, exhausting the raw material gas remaining in the process chamber 201 by means of the exhaust line under a state where the supply of the raw material gas is stopped, modifying the metal-containing layer to form a first layer containing a metal element, nitrogen and carbon by supplying an amine-based gas to the heated wafer 200 in the process chamber 201, exhausting the amine-based gas remaining in the process chamber 201 by means of the exhaust line under a state where the supply of the amine-based gas is stopped, modifying the first layer to form a second layer by supplying a reaction gas different from the raw material gas and the amine-based gas to the heated wafer 200 in the process chamber 201, and exhausting the reaction gas remaining in the process chamber 201 by means of the exhaust line under a state where the supply of the reaction gas is stopped, by a predetermined number of times (once or more). In this case, like the above embodiments, the degree of valve opening of the APC valve 244 in the exhaust line is changed in multiple steps in the act of exhausting the amine-based gas remaining in the process chamber 201.

For example, if metal-based films (TiOCN film, TiOC film and TiCN film) containing Ti is formed, gas containing Ti and chloro groups of titanium tetrachloride ($TiCl_4$) or the like or gas containing Ti and fluoro groups of titanium tetrafluoride ($TiF_4$) or the like may be used as a raw material gas. In this case, the same amine-based gas and reaction gas as in the above embodiments may be used. In addition, the same process conditions as in the above embodiments may be used.

For example, if metal-based films (ZrOCN film, ZrOC film and ZrCN film) containing Zr is formed, gas containing Zr and chloro groups of zirconium tetrachloride ($ZrCl_4$) or the like or gas containing Zr and fluoro groups of zirconium tetrafluoride ($ZrF_4$) or the like may be used as a raw material gas. In this case, the same amine-based gas and reaction gas as in the above embodiments may be used. In addition, the same process conditions as in the above embodiments may be used.

For example, if metal-based films (HfOCN film, HfOC film and HfCN film) containing Hf is formed, gas containing Hf and chloro groups of hafnium tetrachloride ($HfCl_4$) or the like or gas containing Hf and fluoro groups of hafnium tetrafluoride ($HfF_4$) or the like may be used as a raw material gas. In this case, the same amine-based gas and reaction gas as in the above embodiments may be used. In addition, the same process conditions as in the above embodiments may be used.

For example, if metal-based films (TaOCN film, TaOC film and TaCN film) containing Ta is formed, gas containing Ta and chloro groups of tantalum pentachloride ($TaCl_5$) or the like or gas containing Ta and fluoro groups of tantalum pentafluoride ($TaF_5$) or the like may be used as a raw material gas. In this case, the same amine-based gas and reaction gas as in the above embodiments may be used. In addition, the same process conditions as in the above embodiments may be used.

For example, if metal-based films (AlOCN film, AlOC film and AlCN film) containing Al is formed, gas containing Al and chloro groups of aluminum trichloride ($AlCl_3$) or the like or gas containing Al and fluoro groups of aluminum trifluoride ($AlF_3$) or the like may be used as a raw material gas. In this case, the same amine-based gas and reaction gas as in the above embodiments may be used. In addition, the same process conditions as in the above embodiments may be used.

For example, if metal-based films (MoOCN film, MoOC film and MoCN film) containing Mo is formed, gas containing Mo and chloro groups of molybdenum pentachloride ($MoCl_5$) or the like or gas containing Hf and fluoro groups of hafnium pentafluoride ($MoF_5$) or the like may be used as a raw material gas. In this case, the same amine-based gas and reaction gas as in the above embodiments may be used. In addition, the same process conditions as in the above embodiments may be used.

In brief, the present disclosure may be suitably applied to a case where films containing predetermined elements such as semiconductor elements, metal elements and the like are formed.

In addition, although the example of forming the films using the batch type substrate processing apparatus to process a plurality of substrates at once has been described in the above embodiments, the present disclosure is not limited thereto but may be suitably applied to film formation using a single type substrate processing apparatus to process a single substrate or several substrates at once.

In addition, the above embodiments, modifications and applications may be used in proper combinations.

In addition, the present disclosure may be implemented by changing the process recipes of an existing substrate processing apparatus, for example. The change of process recipes may include installing the process recipes of the present disclosure in the existing substrate processing apparatus via a telecommunication line or a recording medium storing the process recipes, and operating the existing substrate processing apparatus to change its process recipes into the process recipes of one or more of the embodiments described.

EXAMPLE

Figure 8A:
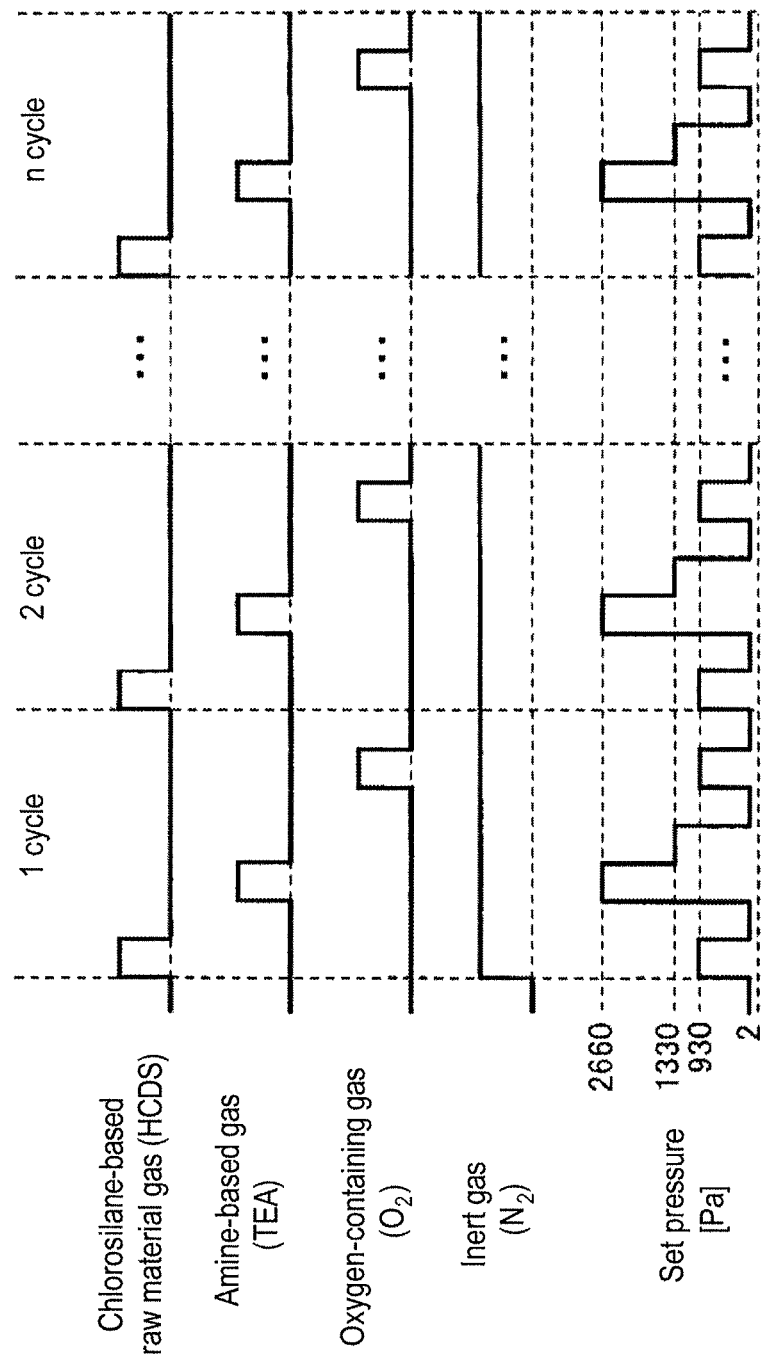

As an example of the present disclosure, the substrate processing apparatus in the above embodiments was used to repeat a batch process of forming SiOC films on a plurality of wafers several times according to the film forming sequence of the above-described first embodiment. In this example, an HCDS gas was used as a raw material gas, a TEA gas was used as an amine-based gas and an $O_2$ gas is used as a reaction gas. FIG. 8A is a timing diagram of gas supply in a film forming sequence of this example. As shown in FIG. 8A, the internal pressure of a process chamber was set to 930 Pa for a HCDS gas supply process, 2 Pa for a residual HCDS gas exhaust process, 2660 Pa for a TEA gas supply process, 1330 Pa for a first residual TEA gas exhaust process and 2 Pa for a second residual TEA gas exhaust process. Other film forming conditions (process conditions in each Step) was set to fall within a range of the process conditions described in the above-described first embodiment.

As a comparative example, a batch process of forming SiOC films on a plurality of wafers several times according to a film forming sequence of the above-described first embodiment where only the second residual TEA gas exhaust process is performed with the first residual TEA gas exhaust process excluded from the film forming sequence. In this comparative example, an HCDS gas was used as a raw material gas, a TEA gas was used as an amine-based gas and an $O_2$ gas is used as a reaction gas. FIG. 8B is a timing diagram of gas supply in a film forming sequence of this comparative example. As shown in FIG. 8B, the internal pressure of a process chamber was set to 930 Pa for a HCDS gas supply process, 2 Pa for a residual HCDS gas exhaust process, 2660 Pa for a TEA gas supply process and 2 Pa for a residual TEA gas exhaust process. Other film forming conditions (process conditions in each Step) was set to fall within a range of the process conditions described in the above-described first embodiment.

The results of the film forming sequence of the example showed that the batch process of forming the SiOC films could be stably repeated without increasing a back pressure of a vacuum pump. The results of the film forming sequence of the comparative example showed that the batch process of forming the SiOC films increased a back pressure of a vacuum pump by one to several times, which caused the exhaust line to be blocked. When the exhaust line was dissembled, it was confirmed that considerable reaction byproducts were adhered to the downstream side of the vacuum pump of the exhaust line, in particular a portion between a trap device and a harm-removing device.

<Additional Aspects of Present Disclosure>

Hereinafter, some aspects of the present disclosure will be additionally stated.

A first aspect of the present disclosure may provide a method of manufacturing a semiconductor device, including: forming a film on a substrate by performing a cycle a predetermined number of times, the cycle including: supplying a raw material gas to a substrate in a process chamber; exhausting the raw material gas remaining in the process chamber through an exhaust line in a state where the supply of the raw material gas is being stopped; supplying an amine-based gas to the substrate in the process chamber; and exhausting the amine-based gas remaining in the process chamber through the exhaust line in a state where the supply of the amine-based gas is being stopped, wherein a degree of valve opening of an exhaust valve disposed in the exhaust line is changed in multiple steps in the act of exhausting the amine-based gas remaining in the process chamber.

In some embodiments, the act of exhausting the amine-based gas remaining in the process chamber includes: exhausting the amine-based gas remaining in the process chamber with the degree of valve opening as a first degree of valve opening; and exhausting the amine-based gas remaining in the process chamber with the degree of valve opening as a second degree of valve opening which is higher than the first degree of valve opening.

In some embodiments, the second degree of valve opening is fully-opened.

In some embodiments, exhausting the amine-based gas remaining in the process chamber includes continuously supplying an inert gas into the process chamber.

In some embodiments, the raw material gas contains a halogen element.

In some embodiments, the raw material gas contains a chlorine element or a fluorine element.

In some embodiments, the raw material gas contains a chlorine element.

In some embodiments, the amine-based gas contains amine.

In some embodiments, the amine-based gas contains at least one amine selected from a group consisting of ethylamine, methylamine, propylamine, isopropylamine, butylamine and isobutylamine.

In some embodiments, the amine-based gas contains at least one amine selected from a group consisting of triethylamine, diethylamine, monoethylamine, trimethylamine, dimethylamine, monomethylamine, tripropylamine, dipropylamine, monopropylamine, triisopropylamine, diisopropylamine, monoisopropylamine, tributylamine, dibutylamine, monobutylamine, triisobutylamine, diisobutylamine and monoisobutylamine.

In some embodiments, exhausting the amine-based gas remaining in the process chamber includes changing a set internal pressure of the process chamber in multiple steps.

In some embodiments, exhausting the amine-based gas remaining in the process chamber includes: exhausting the amine-based gas remaining in the process chamber with the set internal pressure of the process chamber as a first set internal pressure; and exhausting the amine-based gas remaining in the process chamber with the set internal pressure of the process chamber as a second set internal pressure which is lower than the first set internal pressure.

In some embodiments, exhausting the amine-based gas remaining in the process chamber with the set internal pressure of the process chamber as a second set internal pressure includes exhausting the amine-based gas with the maximum exhaust capability of the exhaust line.

In some embodiments, exhausting the amine-based gas remaining in the process chamber includes changing the exhaust capability of the exhaust line in multiple steps.

In some embodiments, exhausting the amine-based gas remaining in the process chamber includes: exhausting the amine-based gas remaining in the process chamber with the exhaust capability of the exhaust line as a first exhaust capability; and exhausting the amine-based gas remaining in the process chamber with the exhaust capability of the exhaust line as a second exhaust capability which is higher than the first exhaust capability.

In some embodiments, exhausting the amine-based gas remaining in the process chamber with the exhaust capability of the exhaust line as a second exhaust capability includes exhausting the amine-based gas with the maximum exhaust capability of the exhaust line.

Another aspect of the present disclosure may provide a method of processing a substrate, including: forming a film on the substrate by performing a cycle a predetermined number of times, the cycle including: supplying a raw material gas to a substrate in a process chamber; exhausting the raw material gas remaining in the process chamber through an exhaust line in a state where the supply of the raw material gas is being stopped; supplying an amine-based gas to the substrate in the process chamber; and exhausting the amine-based gas remaining in the process chamber through the exhaust line in a state where the supply of the amine-based gas is being stopped, wherein a degree of valve opening of an exhaust valve disposed in the exhaust line is changed in multiple steps in the act of exhausting the amine-based gas remaining in the process chamber.

Another aspect of the present disclosure may provide a substrate processing apparatus including: a process chamber configured to accommodate a substrate; a raw material gas supply system configured to supply a raw material gas to the substrate in the process chamber; an amine-based gas supply system configured to supply an amine-based gas to the substrate in the process chamber; an exhaust line configured to exhaust the interior of the process chamber; an exhaust valve disposed in the exhaust line; and a controller configured to control the raw material gas supply system, the amine-based gas supply system, the exhaust line and the exhaust valve such that a film is formed on the substrate by performing a cycle a predetermined number of times, the cycle including: supplying the raw material gas to a substrate in a process chamber; exhausting the raw material gas remaining in the process chamber through an exhaust line in a state where the supply of the raw material gas is being stopped; supplying the amine-based gas to the substrate in the process chamber; and exhausting the amine-based gas remaining in the process chamber through the exhaust line in a state where the supply of the amine-based gas is being stopped, wherein a degree of valve opening of the exhaust valve is changed in multiple steps when the amine-based gas remaining in the process chamber is exhausted.

Another aspect of the present disclosure may provide a program that causes a computer to perform a method of manufacturing a semiconductor device, the method including: forming a film on a substrate by performing a cycle including: supplying a raw material gas to a substrate in a process chamber; exhausting the raw material gas remaining in the process chamber through an exhaust line in a state where the supply of the raw material gas is being stopped; supplying the amine-based gas to the substrate in the process chamber; and exhausting the amine-based gas remaining in the process chamber through the exhaust line in a state where the supply of the amine-based gas is being stopped, wherein a degree of valve opening of an exhaust valve disposed in the exhaust line is changed in multiple steps in the act of exhausting the amine-based gas remaining in the process chamber.

Another aspect of the present disclosure may provide a non-transitory computer-readable recording medium storing a program that causes a computer to perform a method of manufacturing a semiconductor device, the method including: forming a film on a substrate by performing a cycle including: supplying a raw material gas to a substrate in a process chamber; exhausting the raw material gas remaining in the process chamber through an exhaust line in a state where the supply of the raw material gas is being stopped; supplying an amine-based gas to the substrate in the process chamber; and exhausting the amine-based gas remaining in the process chamber through the exhaust line in a state where the supply of the amine-based gas is being stopped, wherein a degree of valve opening of an exhaust valve disposed in the exhaust line is changed in multiple steps in the act of exhausting the amine-based gas remaining in the process chamber.

According to the present disclosure in some embodiments, it is possible to provide a semiconductor device manufacturing method, a substrate processing method, a substrate processing apparatus and a computer-readable recording medium storing instructions for executing such methods, which are capable of preventing byproducts from being deposited in an exhaust pipe when a film is formed.

While certain embodiments have been described, these embodiments have been presented by way of example only, and are not intended to limit the scope of the disclosure. Indeed, the novel methods and apparatuses described herein may be embodied in a variety of other forms; furthermore, various omissions, combinations, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A method of manufacturing a semiconductor device, the method comprising:
forming a film on a substrate by performing a cycle a predetermined number of times, the cycle comprising:
supplying a raw material gas to a substrate in a process chamber;
exhausting the raw material gas remaining in the process chamber through an exhaust line in a state where the supply of the raw material gas is being stopped;
supplying a first reaction gas consisting of carbon, nitrogen and hydrogen to the substrate in the process chamber after exhausting the raw material gas and in the state where the supply of the raw material gas is being stopped;
exhausting the first reaction gas remaining in the process chamber through the exhaust line in a state where the supply of the first reaction gas is being stopped;
supplying a second reaction gas different from the first reaction gas to the substrate in the process chamber; and
exhausting the second reaction gas remaining in the process chamber through the exhaust line in a state where the supply of the second reaction gas is being stopped,
wherein the act of exhausting the first reaction gas remaining in the process chamber comprises:
exhausting at least a portion of the first reaction gas remaining in the process chamber by opening a valve to a degree of valve opening as a first degree of valve opening, while the first degree of valve opening is maintained to gradually exhaust the first reaction gas for a first predetermined period of time until a concentration of the first reaction gas reaches a predetermined concentration at which no significant reaction between the raw material gas remaining in the exhaust line and the first reaction gas exhausted through the exhaust line occurs; and
exhausting a residual of the first reaction gas remaining in the process chamber, after the concentration of the first reaction gas reaches the predetermined concentration, by opening the valve to a degree of valve opening as a second degree of valve opening which is higher than the first degree of valve opening, while the second degree of valve opening is maintained for a second predetermined period of time to exhaust all of the first reaction gas at the predetermined concentration at once.

2. The method of claim 1, wherein the second degree of valve opening is fully-opened.

3. The method of claim 1, wherein the act of exhausting the first reaction gas remaining in the process chamber comprises continuously supplying an inert gas into the process chamber.

4. The method of claim 1, wherein the raw material gas contains a halogen element.

5. The method of claim 1, wherein the raw material gas contains a chlorine element or a fluorine element.

6. The method of claim 1, wherein the raw material gas contains a chlorine element.

7. The method of claim 1, wherein the first reaction gas contains amine.

8. The method of claim 1, wherein the first reaction gas contains at least one amine selected from a group consisting of ethylamine, methylamine, propylamine, isopropylamine, butylamine and isobutylamine.

9. The method of claim 1, wherein the first reaction gas contains at least one amine selected from a group consisting of triethylamine, diethylamine, monoethylamine, trimethylamine, dimethylamine, monomethylamine, tripropylamine, dipropylamine, monopropylamine, triisopropylamine, diisopropylamine, monoisopropylamine, tributylamine, dibutylamine, monobutylamine, triisobutylamine, diisobutylamine and monoisobutylamine.

10. The method of claim 1, wherein the act of exhausting the first reaction gas remaining in the process chamber comprises changing a set internal pressure of the process chamber in multiple steps.

11. The method of claim 10, wherein the act of exhausting the first reaction gas remaining in the process chamber comprises:
   exhausting the first reaction gas remaining in the process chamber with the set internal pressure of the process chamber as a first set internal pressure; and
   exhausting the first reaction gas remaining in the process chamber with the set internal pressure of the process chamber as a second set internal pressure which is lower than the first set internal pressure.

12. The method of claim 11, wherein the act of exhausting the first reaction gas remaining in the process chamber with the set internal pressure of the process chamber as the second set internal pressure comprises exhausting the first reaction gas with the maximum exhaustion capability of the exhaustion line.

13. The method of claim 1, wherein the act of exhausting the first reaction gas remaining in the process chamber comprises changing the exhaustion capability of the exhaustion line in multiple steps.

14. The method of claim 13, wherein the act of exhausting the first reaction gas remaining in the process chamber comprises:
   exhausting the first reaction gas remaining in the process chamber with the exhaustion capability of the exhaustion line as a first exhaustion capability; and
   exhausting the first reaction gas remaining in the process chamber with the exhaustion capability of the exhaustion line as a second exhaustion capability which is higher than the first exhaustion capability.

15. The method of claim 14, wherein the act of exhausting the first reaction gas remaining in the process chamber with the exhaustion capability of the exhaustion line as a second exhaustion capability comprises exhausting the first reaction gas with the maximum exhaustion capability of the exhaustion line.

16. The method of claim 1, wherein the second reaction gas contains at least one gas selected from a group consisting of oxygen-containing gas and nitrogen-containing gas.

17. A substrate processing apparatus comprising:
   a process chamber configured to accommodate a substrate;
   a raw material gas supply system configured to supply a raw material gas to the substrate in the process chamber;
   a first reaction gas supply system configured to supply a first reaction gas consisting of carbon, nitrogen and hydrogen to the substrate in the process chamber;
   a second reaction gas supply system configured to supply a second reaction gas different from the first reaction gas to the substrate in the process chamber;
   an exhaustion line configured to exhaust the interior of the process chamber;
   an exhaustion valve disposed in the exhaustion line; and
   a controller configured to control the raw material gas supply system, the first reaction gas supply system, the second reaction gas supply system, the exhaustion line and the exhaustion valve such that a film is formed on the substrate by performing a cycle a predetermined number of times, the cycle comprising:
      supplying the raw material gas to the substrate in the process chamber;
      exhausting the raw material gas remaining in the process chamber through an exhaustion line in a state where the supply of the raw material gas is being stopped;
      supplying the first reaction gas to the substrate in the process chamber after exhausting the raw material gas and in the state where the supply of the raw material gas is being stopped;
      exhausting the first reaction gas remaining in the process chamber through the exhaustion line in a state where the supply of the first reaction gas is being stopped;
      supplying the second reaction gas to the substrate in the process chamber; and
      exhausting the second reaction gas remaining in the process chamber through the exhaustion line in a state where the supply of the second reaction gas is being stopped,
   wherein the act of exhausting the first reaction gas remaining in the process chamber comprises:
   exhausting at least a portion of the first reaction gas remaining in the process chamber by opening a valve to a degree of valve opening as a first degree of valve opening, while the first degree of valve opening is maintained to gradually exhaust the first reaction gas for a first predetermined period of time until a concentration of the first reaction gas reaches a predetermined concentration at which no significant reaction between the raw material gas remaining in the exhaust line and the first reaction gas exhausted through the exhaust line occurs; and
   exhausting a residual of the first reaction gas remaining in the process chamber, after the concentration of the first reaction gas reaches the predetermined concentration, by opening the valve to a degree of valve opening as a second degree of valve opening which is higher than the first degree of valve opening, while the second degree of valve opening is maintained for a second predetermined period of time to exhaust all of the first reaction gas at the predetermined concentration at once.

18. A non-transitory computer-readable recording medium storing a program that causes a computer to perform a method of manufacturing a semiconductor device, the method comprising:
   forming a film on a substrate by performing a cycle comprising:
      supplying a raw material gas to a substrate in a process chamber;
      exhausting the raw material gas remaining in the process chamber through an exhaustion line in a state where the supply of the raw material gas is being stopped;
      supplying a first reaction gas consisting of carbon, nitrogen and hydrogen to the substrate in the process chamber after exhausting the raw material gas and in the state where the supply of the raw material gas is being stopped;
      exhausting the first reaction gas remaining in the process chamber through the exhaust line in a state where the supply of the first reaction gas is being stopped;
      supplying a second reaction gas different from the first reaction gas to the substrate in the process chamber; and exhausting the second reaction gas remaining in the process chamber through the exhaust line in a state where the supply of the second reaction gas is being stopped, wherein the act of exhausting the first reaction gas remaining in the process chamber comprises:

exhausting at least a portion of the first reaction gas remaining in the process chamber by opening a valve to a degree of valve opening as a first degree of valve opening, while the first degree of valve opening is maintained to gradually exhaust the first reaction gas for a first predetermined period of time until a concentration of the first reaction gas reaches a predetermined concentration at which no significant reaction between the raw material gas remaining in the exhaust line and the first reaction gas exhausted through the exhaust line occurs; and exhausting a residual of the first reaction gas remaining in the process chamber, after the concentration of the first reaction gas reaches the predetermined concentration, by opening the valve to a degree of valve opening as a second degree of valve opening which is higher than the first degree of valve opening, while the second degree of valve opening is maintained for a second predetermined period of time to exhaust all of the first reaction gas at the predetermined concentration at once.

\* \* \* \* \*